(12) United States Patent
Marimuthu et al.

(10) Patent No.: US 7,378,300 B2
(45) Date of Patent: May 27, 2008

(54) INTEGRATED CIRCUIT PACKAGE SYSTEM

(75) Inventors: Pandi Chelvam Marimuthu, Singapore (SG); Il Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 69 days.

(21) Appl. No.: 11/234,528

(22) Filed: Sep. 22, 2005

(65) Prior Publication Data
US 2007/0080437 A1    Apr. 12, 2007

(51) Int. Cl.
*H01L 21/00* (2006.01)
(52) U.S. Cl. ............... 438/124; 257/667; 257/E23.116
(58) Field of Classification Search .............. 257/666, 257/667, 675, 787, 727, E23.116; 438/112, 438/111, 113, 123, 124
See application file for complete search history.

(56) References Cited

U.S. PATENT DOCUMENTS 5,420,752 A * 5/1995 Variot ..................... 361/709
6,001,671 A * 12/1999 Fjelstad ................... 438/112
6,008,074 A * 12/1999 Brand ..................... 438/126
6,509,635 B1  1/2003 Poddar
6,576,988 B2  6/2003 Corisis
6,590,281 B2 * 7/2003 Wu et al. ................. 257/684
6,773,961 B1  8/2004 Lee et al.
6,812,063 B2 * 11/2004 Huang ..................... 438/110
6,878,570 B2 * 4/2005 Lyu et al. ................. 438/106
2004/0061204 A1  4/2004 Han et al.
2004/0061205 A1  4/2004 Han et al.
2004/0087061 A1* 5/2004 Ma et al. .................. 438/122

* cited by examiner

*Primary Examiner*—David A Zarneke
*Assistant Examiner*—Jenny L Wagner
(74) *Attorney, Agent, or Firm*—Mikio Ishimaru

(57) ABSTRACT

An integrated circuit package system is provided including forming a leadframe structure having a encapsulant space provided predominantly inside the leadframe structure and attaching a die to the leadframe structure in the encapsulant space inside the leadframe structure. The system further includes electrically connecting the die to the leadframe structure and injecting encapsulant into the encapsulant space to form the integrated circuit package system.

32 Claims, 25 Drawing Sheets

INTEGRATED CIRCUIT PACKAGE SYSTEM

TECHNICAL FIELD

The present invention relates generally to integrated circuits, and more particularly to package structures for integrated circuits.

BACKGROUND ART

In the electronics industry, a continuing objective is to further and further reduce the size and weight of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. The IC chips, commonly called dies, are usually made from a semiconductor material such as silicon or gallium arsenide. Photolithographic techniques are used to form the various semiconductor devices in multiple layers on the dies.

Dies are encapsulated in a molded plastic package that has connectors or leads on the exterior of the package that function as input/output terminals for the die inside the package. The package includes a leadframe, a die mounted on the leadframe, and wires connecting the die to the leadframe.

The die is conventionally mounted to the top surface of the leadframe with, for example, a layer of an adhesive or an adhesive film, and then electrically connected to the leadframe by a number of fine, conductive wires, typically gold ("Au") or aluminum ("Al"). The wires are attached to the die at the bonding pads of the die, which are located around the periphery of the die.

After the wires are attached, the die, the leadframe, and the conductive wires are encapsulated in a mold compound, such as plastic or epoxy. The encapsulation protects the leadframe, the die, and the fine conductive wires from physical, electrical, moisture, and/or chemical damage.

The encapsulation process begins by placing the leadframe, the die, and the fine conductive wires in a mold. Next, a mold compound is injected into the mold. The mold compound flows through the mold, encasing the leadframe, the die, and the conductive wires.

Typically, a mold encapsulates multiple semiconductor devices at the same time. A two part mold mounted on a hydraulic press is generally used.

Initially the two halves of the mold are held apart. One or more lead frames containing semiconductor devices are placed in an open half of the mold. The hydraulic press is then actuated and the mold closed, forming a cavity around each semiconductor die. It is not unusual for a mold to contain hundreds of cavities. Each of these cavities is connected by one or more gates, channels, and runners to one or more softened plastic central reservoirs or pots. A worm screw or ram compresses the plastic so that it flows into the cavities. As soon as the plastic has hardened, the mold is opened and the molded plastic packages removed.

Frequently, moveable pins are built into the mold to align the mold parts, to hold the lead frames in a particular location during molding, or to provide automatic ejection of the encapsulated parts. Also, the mold may contain other moving parts such as variable gates, vents, and dams. Thus, molds for encapsulating electronic parts, particularly semiconductor parts, are often very complicated.

In order to push liquefied plastic from the reservoirs into the many cavities, it is frequently necessary to inject or transfer the plastic at very high pressures. If the mold halves fail to seal tightly against each other or against the lead frames, undesired or unintended crevices may be present therebetween. At such high pressures, the crevices fill with plastic during encapsulation, producing unwanted thin webs of plastic. These thin webs of plastic are referred to as "flash" and can result from such imperfect sealing of the mold. Before the encapsulated electronic devices can be used, this flash must be removed. This increases the cost of manufacture and is undesirable. Also, flash is a significant cause of mold wear, requires additional labor for mold cleaning between molding cycles, and increases mold downtime.

In order to minimize flash, great pains are generally taken to machine the mating surfaces of the mold halves flat and parallel where they are to seal. Usually, they are carefully inspected for planarity during manufacture and after installation in the press. Powerful hydraulic cylinders in the mold force the mold halves tightly against the lead frames and each other. However, the force that can be applied in an effort to seal the mold is limited, since excessive force causes coining of the lead frames and rapid mold wear. Despite these efforts, flash continues to occur, even in the most carefully fabricated molds. The larger the mold, the more severe the problem.

Thus, a need still remains for improved encapsulation methods for electronic devices that reduce size, reduce weight, and eliminate unwanted flash.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a leadframe structure having a encapsulant space provided predominantly inside the leadframe structure and attaching a die to the leadframe structure in the encapsulant space inside the leadframe structure. The system further includes electrically connecting the die to the leadframe structure and injecting encapsulant into the encapsulant space to form the integrated circuit package system.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
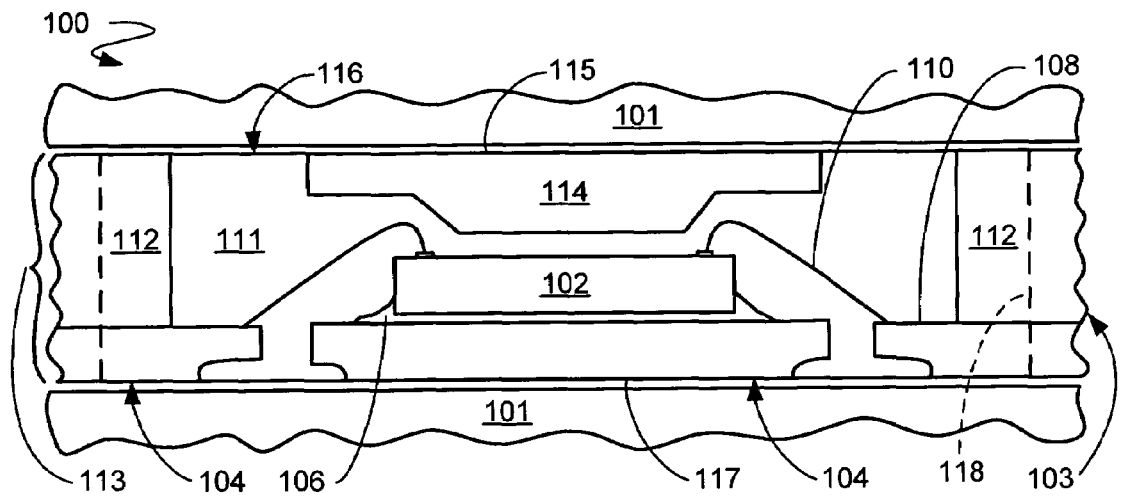
FIG. 1 is a cross sectional view, taken along line 1-1 in FIG. 2, of an integrated circuit package system in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the FIGS. In addition where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of the die, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

As semiconductor technology improves, the demand for more interconnected and complex integrated circuit ("IC") chips increases. Molded integrated circuit package systems, such as molded dual inline integrated circuit package systems, quad flat integrated circuit package systems, or small outline integrated circuit package systems, have limitations. These limitations include encapsulant on both the bottom and top of the die. In order to make contact with a printed circuit board, leads must be long and bent into various shapes. Longer leads reduce the utilization of the leadframe. Also, the encapsulant and the leads prevent stacking of the molded integrated circuit package systems.

In order to reduce the profile of molded integrated circuit package systems, lower profile molded integrated circuit package systems, such as quad non leaded integrated circuit package systems, do not have encapsulant on the bottom of the leadframe. Thus, the quad non leaded integrated circuit package systems have a lower profile than traditional molded integrated circuit package systems. However, lower profile molded integrated circuit package systems have several problems. Encapsulant still forms the mold body on top of the leadframe, thus preventing stacking of integrated circuit package systems or inverted mounting. In addition, due to mold flash limitations, the size of lower profile molded integrated circuit package systems is limited, in general to 12 mm by 12 mm.

Mold flash is a problem during the encapsulation of certain semiconductor integrated circuit package systems, such as non leaded packages. Typically, multiple semiconductor devices are mounted on a lead frame and the leadframe placed in a mold. A two part mold is generally used. Each half of the mold has a stiff backplate that is mounted on a platen of a hydraulic press. One or both halves of the mold contain mold cavities to be used in forming encapsulant around a semiconductor die.

The two halves of the mold are held apart. The lead frame containing semiconductor devices is placed in an open half of the mold. The hydraulic press is actuated and the mold closed, forming a single cavity around each semiconductor die. It is not unusual for a mold to contain up to $10^2$ to $10^3$ cavities. Each of these cavities is connected by one or more gates, channels, and runners to one or more central reservoirs, or pots, in which a softened encapsulant is placed. A worm screw or ram compresses the encapsulant so that it flows into the cavities. As soon as the encapsulant has hardened, the mold is opened and the encapsulated assemblies removed.

Frequently, moveable pins are built into the mold to align the mold parts, to hold the lead frames in a particular location during molding, or to provide automatic ejection of the encapsulated parts. Also, the mold may contain other moving parts such as variable gates, vents, and dams. Thus, molds for encapsulating electronic parts, particularly semiconductor parts, are often very complicated and have numerous mechanisms protruding from the backplates of the mold.

In order to push liquefied encapsulant from the reservoirs into the many cavities, it is frequently necessary to inject or transfer the encapsulant at pressures exceeding $10^3$ psi. If the mold halves fail to seal tightly against each other or against the lead frame, undesired or unintended crevices may be present therebetween. At such high pressures, the crevices fill with encapsulant during encapsulation, producing thin webs of encapsulant where none are desired. These thin webs of encapsulant are referred to as flash and result generally from imperfect sealing of the mold. Before the encapsulated electronic devices can be used, this flash must be removed. This increases the cost of manufacture and is undesirable. Also, flash is a significant cause of mold wear, requires additional labor for mold cleaning between molding cycles, and increases mold down-time.

To overcome the mold flash problem in quad non leaded packages, film assisted molding is attempted as one possible solution, whereby, molding machines will have special film handling mechanisms that feeds fresh film between leadframes' bottom surface and mold plate, for each molding cycle. The film is a compressible material and hence, provides some sealing effect around the profile of the leads where mold clamping is done and controls the flash to some extent. However, this solution increases the cost of manufacturing as fresh film is used in each mold cycle, while introducing other yield and quality issues, such as undulations in film across the mold surface causing lifting of leadframe paddle during clamping and resulting in yield loss; wrinkling of film around the leads due to compression that leaves the molded surface with wrinkles, making it brittle, prone to micro-cracks and chipping.

Another solution attempted in industry is to laminate a layer of film or tape before molding process, typically before die attach process. This approach, while avoiding the need to have special purpose molding machine with film handling capability, merely shifts the burden upfront, with special machines required for both laminating the film/tape before die attach and de-laminate it after molding process.

Also, prior to encapsulation, the adhesive film creates additional challenges during wire bonding. The wire bonding process preferably requires the heating of leadframes over 200° C. and up to 230° C. However such heating causes out gassing of contaminants from the adhesive film. The contaminants settle on the leadframe, causing poor bonding of wires to the leadframe. In order to reduce out gassing the heating is limited to below 200° C. However, reducing the temperature lowers the quality of wire bonding. In addition, the adhesive film limits the clamping force used to secure the leadframe. The leadframe must be securely clamped during wire bonding. However, excessive clamping of a leadframe on adhesive film can cause deformation of the adhesive film, resulting in a non-uniform bottom of the leadframe.

After the integrated circuit package systems have been cleaned and prepared, they are placed in a singulation device, such as a saw singulation device or punch singulation device. If the integrated circuit package systems are punch singulated they are secured in a singulation dieset. The bottom half of the singulation dieset is flat and the integrated circuit package systems lie flat on its surface. The top half of the singulation dieset is curved and secures the outer edge of the integrated circuit package systems with a narrow edge of the top half of the singulation dieset. A punch then singulates the integrated circuit package systems.

The punch singulation system has several limitations. Due to its small size, the narrow edge of the singulation dieset is highly susceptible to breakage. Breakage of the narrow edge makes the tool life short and inconsistent. Thus, integrated circuit package system yield is poor and inconsistent. These inconsistencies and low yields create high maintenance costs for punch singulation systems, while also increasing the cost of quality with additional resources required for inspection to screen out rejects.

Figure 2:
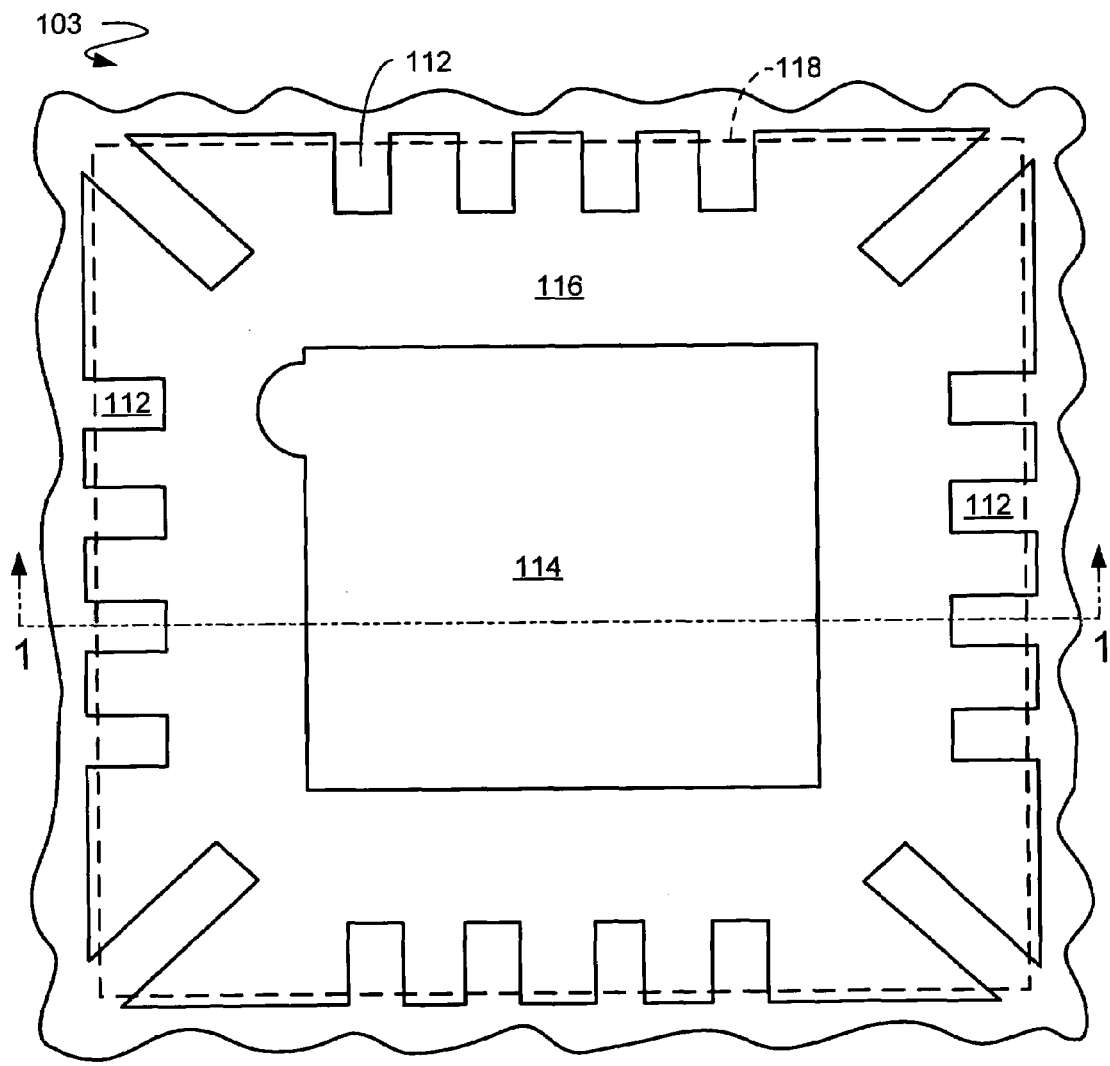
FIG. 2 is a top view of the integrated circuit package system shown in FIG. 1.

Referring now to FIG. 1, therein is shown a cross section 100 of a mold 101 and an integrated circuit package system 103, the cross section of the integrated circuit package system 103 being taken along line 1-1 in FIG. 2, in accordance with an embodiment of the present invention. A die 102 is positioned over and attached to (hereinafter referred to as "attached to") a first leadframe 104 with an epoxy 106. The first leadframe 104 has leads 108 which are electrically connected to the die 102 with wires 110.

An encapsulant space 111 is formed on the first leadframe 104. The encapsulant space 111 is the volume inside and within the top and bottom surfaces of a second leadframe 112 and encloses at least the die 102, the epoxy 106, and the wires 110. The second leadframe 112 is mounted on the first leadframe 104. The second leadframe 112 and the first leadframe 104 form a leadframe structure 113, having a planar top surface 115 and a planar bottom surface 117. The term "planar" for a surface is defined as being completely flat over the entire area of the surface of a structure. A heat sink 114 is positioned above the die 102 with at least a portion in the encapsulant space 111. The heat sink 114 may be a separate structure or it may be a portion of the second leadframe 112 that functions as a heat sink. An encapsulant 116 in the encapsulant space 111 encapsulates at least portions of the die 102, the first leadframe 104, the second leadframe 112, the wires 110, and the heat sink 114. The encapsulant 116 is coplanar with the planar top surface 115 and the planar bottom surface 117. Singulation occurs along cut lines 118.

The integrated circuit package system 103 does not require a mold cavity and thus has several advantages. One advantage is the elimination of the mold body on the exterior of the integrated circuit package system. Elimination of the mold body allows the creation of much thinner integrated circuit package systems, leading to lower and ultra-lower profiles. The smaller profiles can be enhanced through the reduction of the first and second leadframes, along with reduction of die thickness and loop height.

Another advantage is improved thermal performance in single and stacked integrated circuit package systems. The thermal performance is enhanced by the elimination of an exterior mold body, thereby eliminating a barrier to heat flow and directly exposing the leadframes 104 and 112 and the heat sink 114 on the exterior of the integrated circuit package system 103.

Another advantage of the integrated circuit package system 103 is the availability of larger body size with increased numbers of leads. Clamping the leadframe structure 113 between the mold 101 eliminates the need for adhesive film and reduces mold flash. The mold 101 reduces mold flash by preventing the first leadframe 104 from separating from the mold 101. Thus, by clamping the leadframe structure 113 and reducing mold flash, the size of the integrated circuit package system 103 may be greater than 12 mm by 12 mm.

Other advantages of the integrated circuit package system 103 include the ability to stack the integrated circuit package system 103 and invert the integrated circuit package system 103 before mounting. Inverted mounting may, in some embodiments, improve thermal dissipation.

As will be explained in greater detail below (FIG. 13), a further advantage of the integrated circuit package system 103 is the additional clamping achieved during molding from the mold 101, which is planar.

Referring now to FIG. 2, therein is shown a top view of the integrated circuit package system 103. The encapsulant 116 surrounds the sides and bottoms of the second leadframe 112 and the heat sink 114, leaving their top surfaces exposed.

Figure 3:
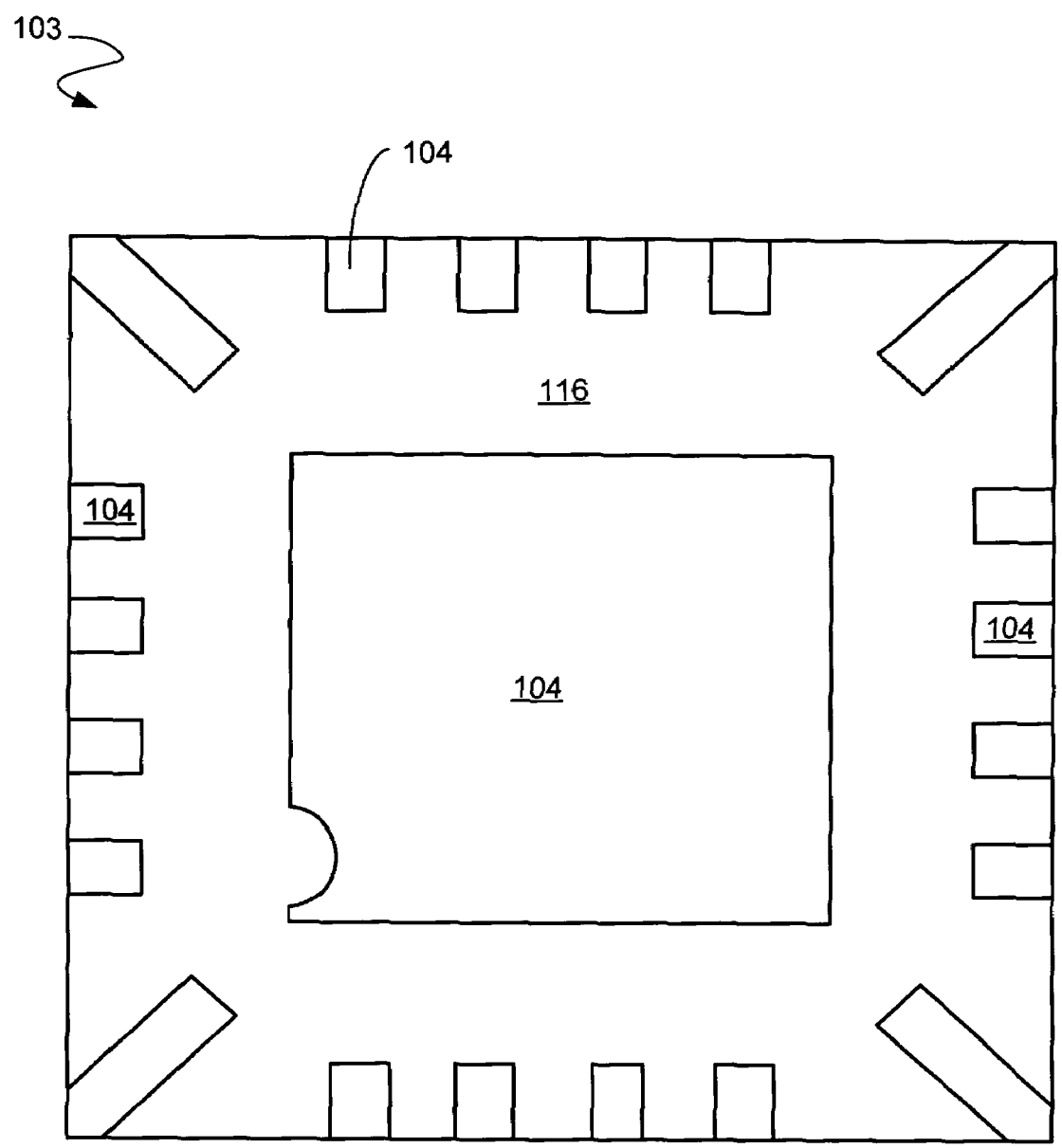
FIG. 3 is a bottom view of the integrated circuit package system of FIG. 1.

Referring now to FIG. 3, therein is shown a bottom view of the integrated circuit package system 103 after singulation. The encapsulant 116 surrounds the sides and top of the first leadframe 104, leaving its bottom surface exposed.

The first leadframe 104 has been singulated and only carries the one die 102. However, in earlier manufacturing steps, the first leadframe 104 may carry many dies 102.

Figure 4:
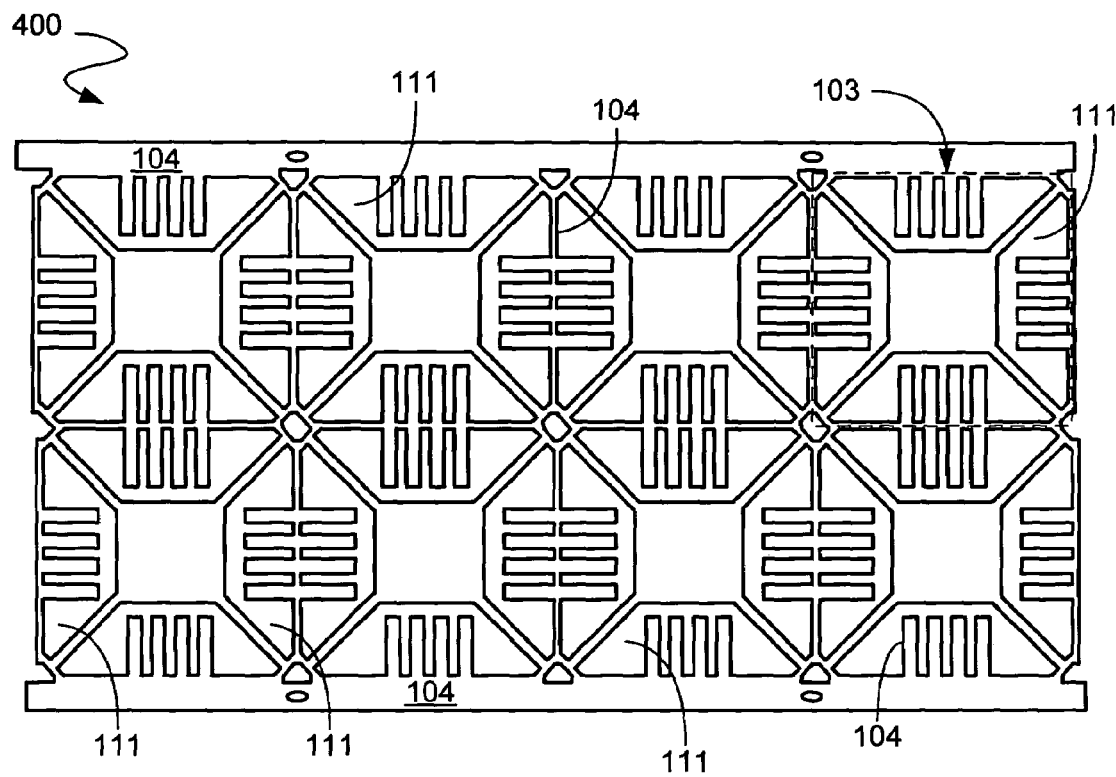
FIG. 4 is a portion of a pre-singulated integrated circuit package system in an intermediate stage of manufacture, before molding and singulation therefrom of the integrated circuit package system shown in FIG. 1.

Referring now to FIG. 4, therein is shown a portion of a pre-singulated integrated circuit package system 400 in an intermediate stage of manufacture, before molding and singulation therefrom of the integrated circuit package system 103 (FIG. 1). The first leadframe 104 has been manufactured using standard processes and is ready for die attachment and wire bonding in the encapsulant space 111.

Figure 5:
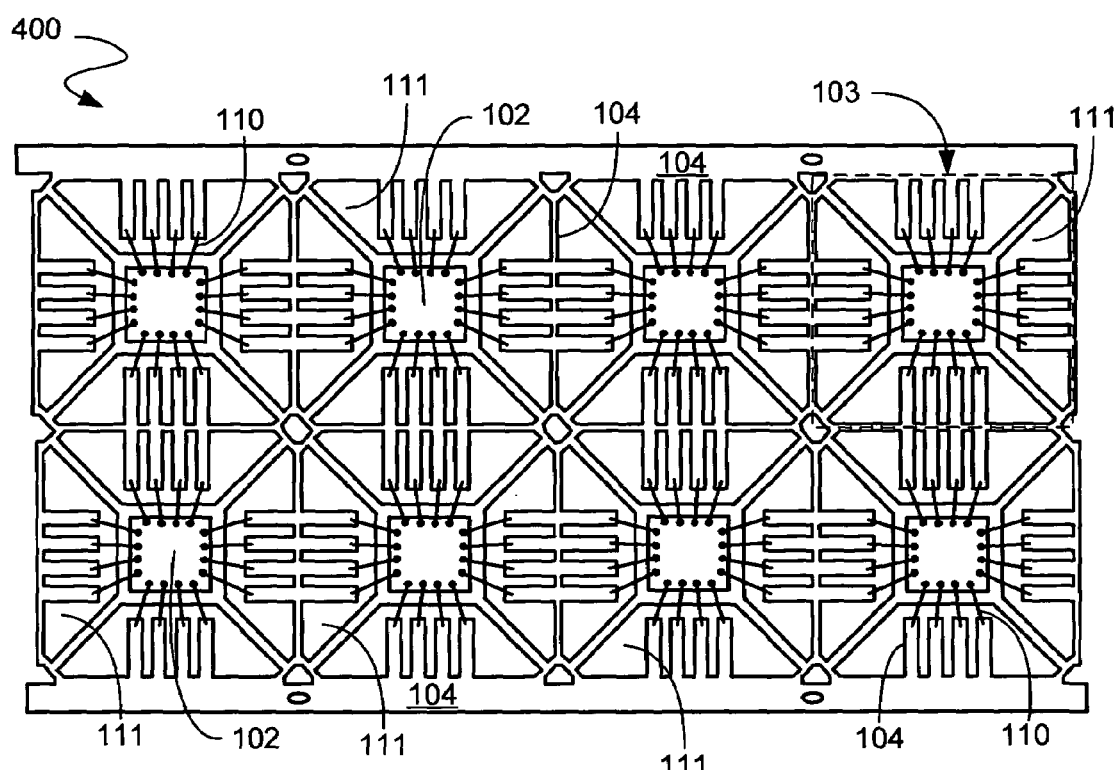
FIG. 5 is the pre-singulated integrated circuit package system portion of FIG. 4 after die attachment and wire bonding.

Referring now to FIG. 5, therein is shown the pre-singulated integrated circuit package system 400 after further processing. The dies 102 have been attached to the first leadframe 104 with the epoxy 106 (FIG. 1). The wires 110 electrically connect the dies 102 to the first leadframe 104. The encapsulant space 111 encloses the die 102, the epoxy 106 (FIG. 1), and the wires 110.

Figure 6:
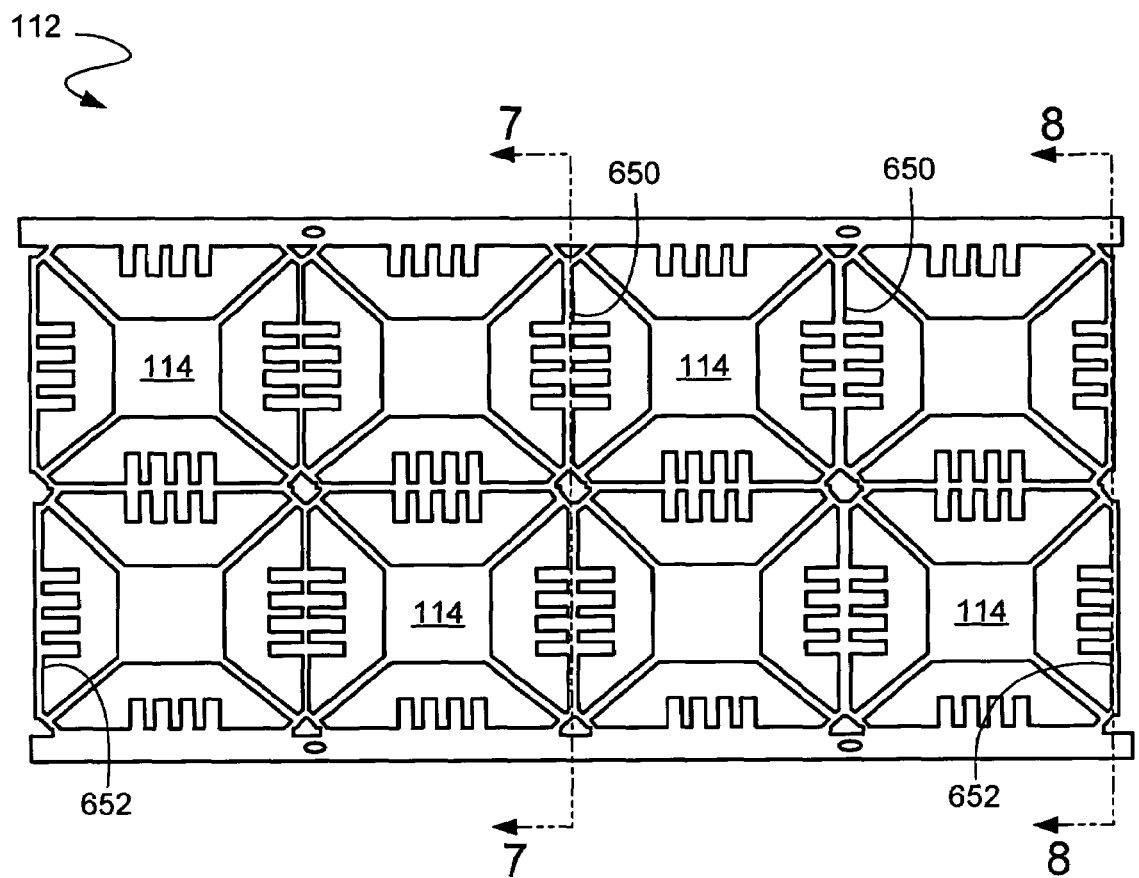
FIG. 6 is the second leadframe of the pre-singulated integrated circuit package system shown in FIG. 10.
Figure 10:
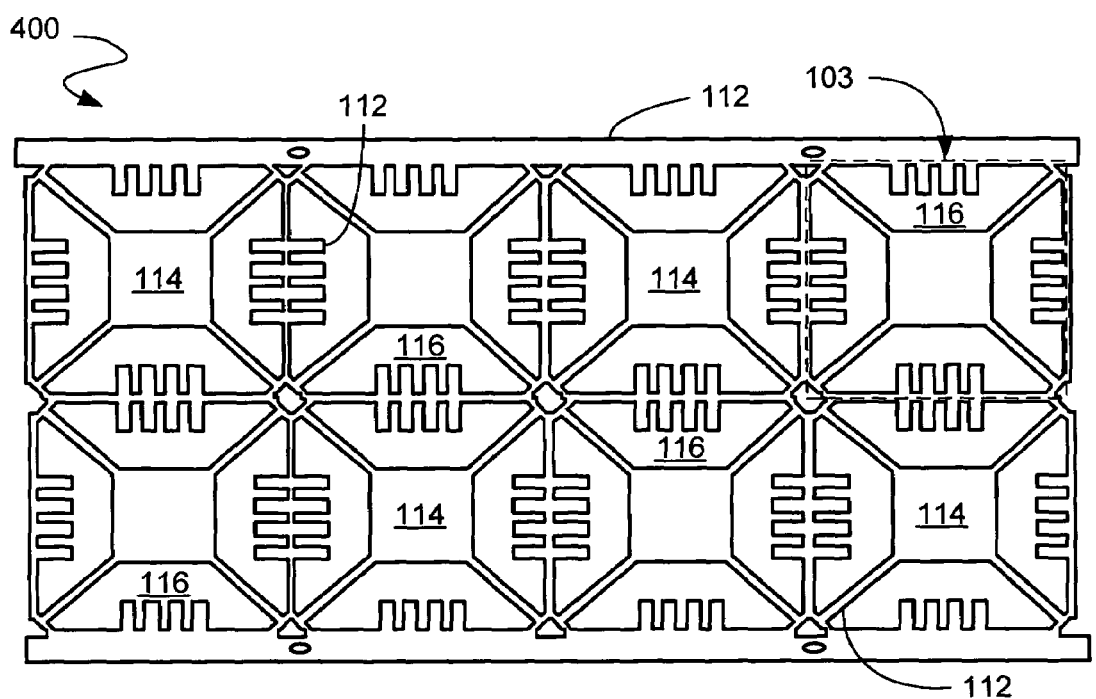
FIG. 10 is the top side of the pre-singulated integrated circuit package system of FIG. 9 after encapsulation.

Referring now to FIG. 6, therein is shown the second leadframe 112 of the pre-singulated integrated circuit package system 400 (FIG. 10). The second leadframe 112 has been manufactured using standard processes. The second leadframe 112 has inner walls 650 and outer walls 652.

The second leadframe 112 may be shared among different integrated circuit package systems having the same body size, lead count, and pitch, thus optimizing manufacturing costs. In addition, the second leadframe 112 may be manufactured from materials of differing hardness, thus optimizing contact and sealing between leads. Furthermore, lower cost, non-conductive material may be used when stackability is not required.

Figure 7:
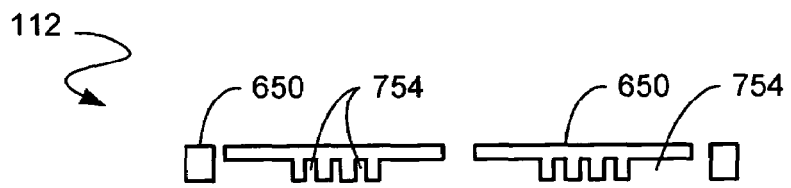
FIG. 7 is a cross sectional view of the second leadframe of FIG. 6, taken on line 7-7 therein.

Referring now to FIG. 7, therein is shown a cross section of the second leadframe 112, taken along line 7-7 in FIG. 6. Removal of material from the inner walls 650 of the second leadframe 112 forms channels 754, enhancing mold compound flow during molding.

Figure 8:
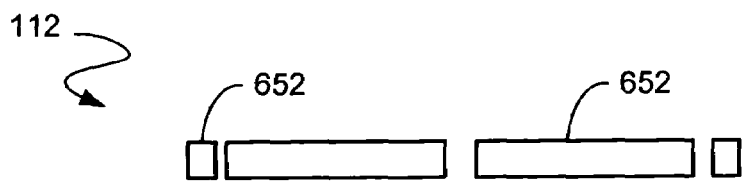
FIG. 8 is a cross sectional view of the second leadframe of FIG. 6, taken on line 8-8 therein.

Referring now to FIG. 8, therein is shown a cross section of the second leadframe 112, taken along line 8-8 in FIG. 6. In order to provide complete sealing of mold compound flow during molding, no material is removed from the outer walls 652 of the second leadframe 112.

Figure 9:
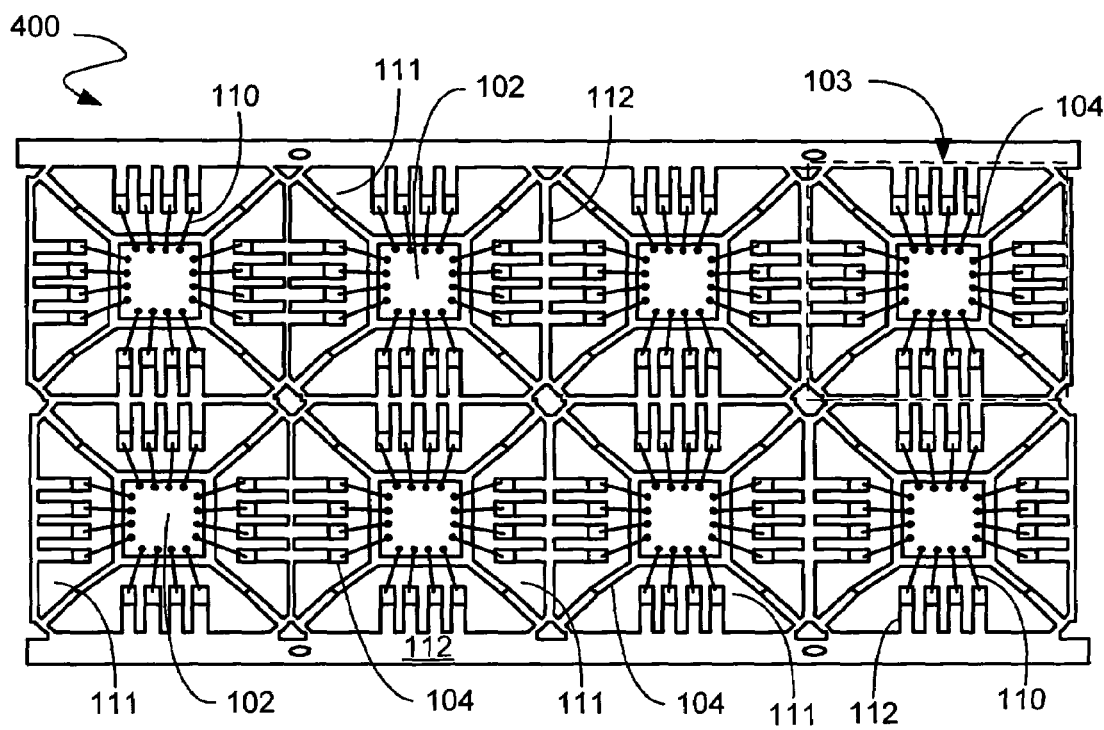
FIG. 9 is a top view of the pre-singulated integrated circuit package system of FIG. 10 after placement of the second leadframe on the first leadframe and prior to encapsulation thereof.

Referring now to FIG. 9, therein is shown a top view of the pre-singulated integrated circuit package system 400 after further processing. The second leadframe 112 has been placed on the first leadframe 104. The first leadframe 104, the dies 102, the wires 110, the encapsulant space 111, and the second leadframe 112 are now ready for encapsulation. For clarity of illustration, the heat sink 114 (FIG. 6) is not shown.

Referring now to FIG. 10, therein is shown the top side of the pre-singulated integrated circuit package system 400 after further processing. The heat sinks 114 have been positioned above the dies 102 (FIG. 9). The encapsulant 116 has been injected into the encapsulant space 111 (FIG. 9) of the pre-singulated integrated circuit package system 400, encapsulating the pre-singulated integrated circuit package system 400 but leaving the top side of the second leadframe 112 and the heat sinks 114 exposed.

Figure 11:
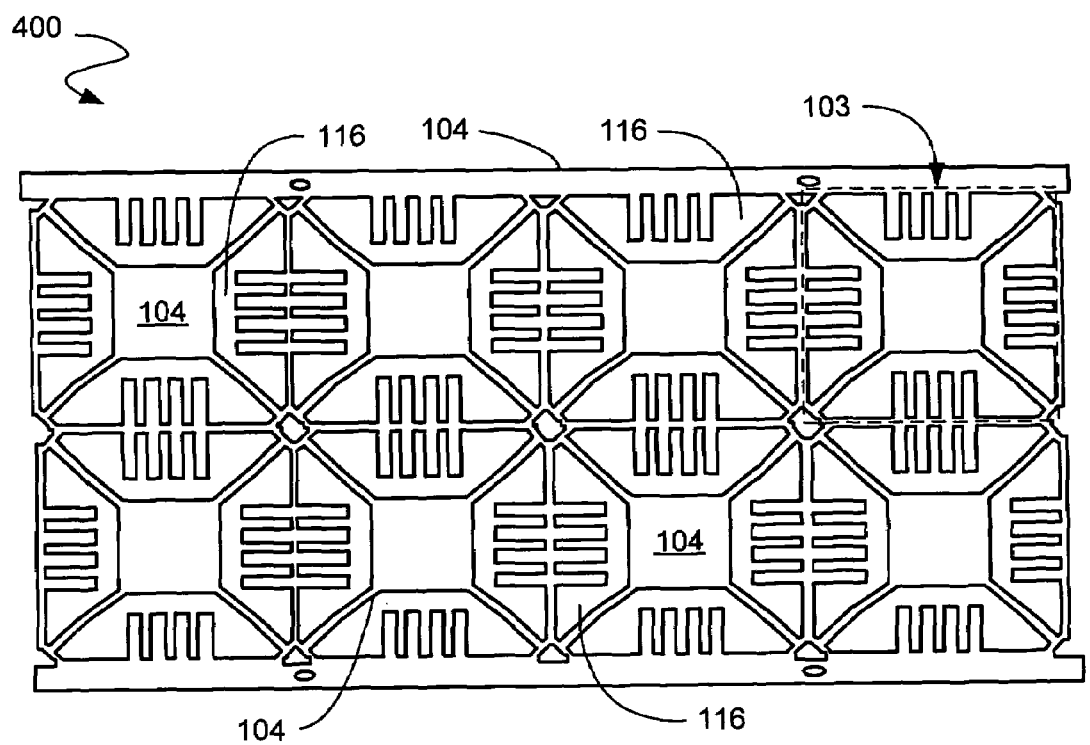
FIG. 11 is the bottom side of the pre-singulated integrated circuit package system shown in FIG. 10.

Referring now to FIG. 11, therein is shown the bottom side of the pre-singulated integrated circuit package system 400. The encapsulant 116 has encapsulated the pre-singulated integrated circuit package system 400, leaving the bottom side of the first leadframe 104 exposed.

Figure 12:
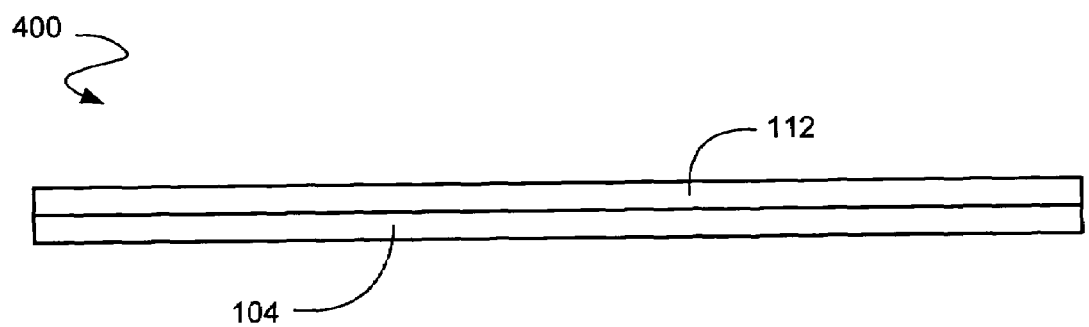
FIG. 12 is a side view of the pre-singulated integrated circuit package system shown in FIG. 10.

Referring now to FIG. 12, therein is shown a side view of the pre-singulated integrated circuit package system 400. The first leadframe 104 and the second leadframe 112 surround the encapsulant space 111 (FIG. 9).

Figure 13:
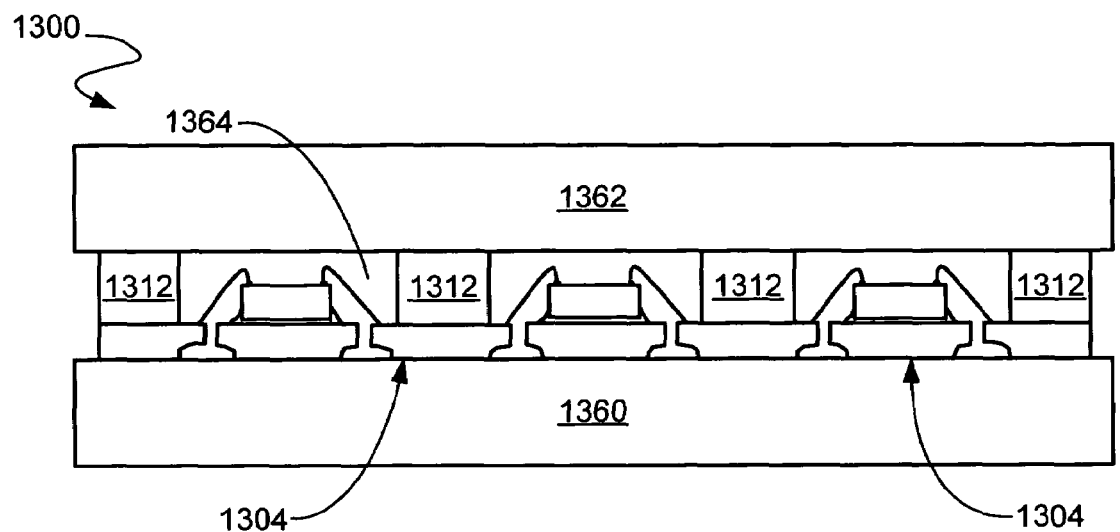
FIG. 13 is a cross sectional view of a molding system.

Referring now to FIG. 13, therein is shown a cross sectional view of a molding system 1300. A first leadframe 1304 is placed on a bottom cavity bar 1360, which is planar. A top cavity bar 1362, which is planar, is pressed on a second leadframe 1312. The first leadframe 1304, the second leadframe 1312, the bottom cavity bar 1360, and the top cavity bar 1362 enclose and seal an encapsulant space 1364.

The molding system 1300 has several advantages. One advantage is the tight clamping of the first leadframe 1304 and the second leadframe 1312. The tight clamping eliminates the need for adhesive film under the first leadframe 1304. Thus, the first leadframe 1304 will not separate and lift from the bottom cavity bar 1360 when encapsulant is injected into the encapsulant space 1364, and mold flash is thereby reduced.

Another advantage is the increased stability provided by eliminating adhesive film and clamping the first leadframe 1304 and the second leadframe 1312. The increased stability improves the quality and yield in wire bonding process.

Still another advantage is the elimination of the mold cavity. Elimination of the mold cavity removes restrictions on grouping of body size to suit a given mold cavity size. Also, elimination of mold cavity simplifies the top mold plate and hence, the cost of molding tool for the integrated circuit package system. Thus, tooling can be shared across different sized integrated circuit package systems, reducing the investment in equipment.

Still another advantage is the reduction in mold flash achieved by clamping the first leadframe 1304 and the second leadframe 1312. This kind of clamping allows integrated circuit package systems of larger body size, greater than 12×12 square mm to be molded without issues associated with mold flash, without requiring tape or film.

The molding system 1300 creates a molded integrated circuit package system 1404 (FIG. 14) that must be singulated.

Figure 14:
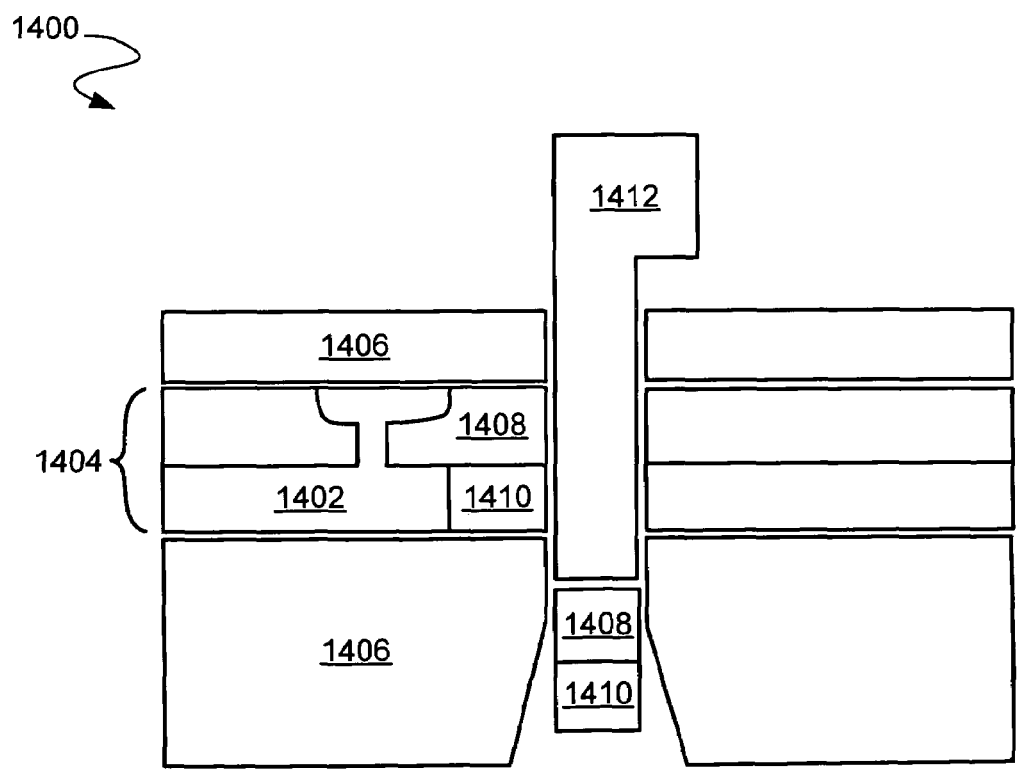
FIG. 14 is a cross sectional view of an integrated circuit package system singulation system.

Referring now to FIG. 14, therein is shown a cross sectional view of a integrated circuit package system singulation system 1400. The molded integrated circuit package system 1404 has been encapsulated with an encapsulant 1402. The molded integrated circuit package system 1404 is secured in a singulation dieset 1406 by clamping a first leadframe 1408 and a second leadframe 1410. A punch 1412 singulates the molded integrated circuit package system 1404.

The molded integrated circuit package system 1404 is flat, providing advantages to the integrated circuit package system singulation system 1400. Narrow edges have been eliminated from the singulation dieset 1406 for the integrated circuit package system singulation system 1400. Elimination of the narrow edges reduces inconsistent breakage of tools, increases yields, and lowers the maintenance costs for the integrated circuit package system singulation system 1400.

Figure 15:
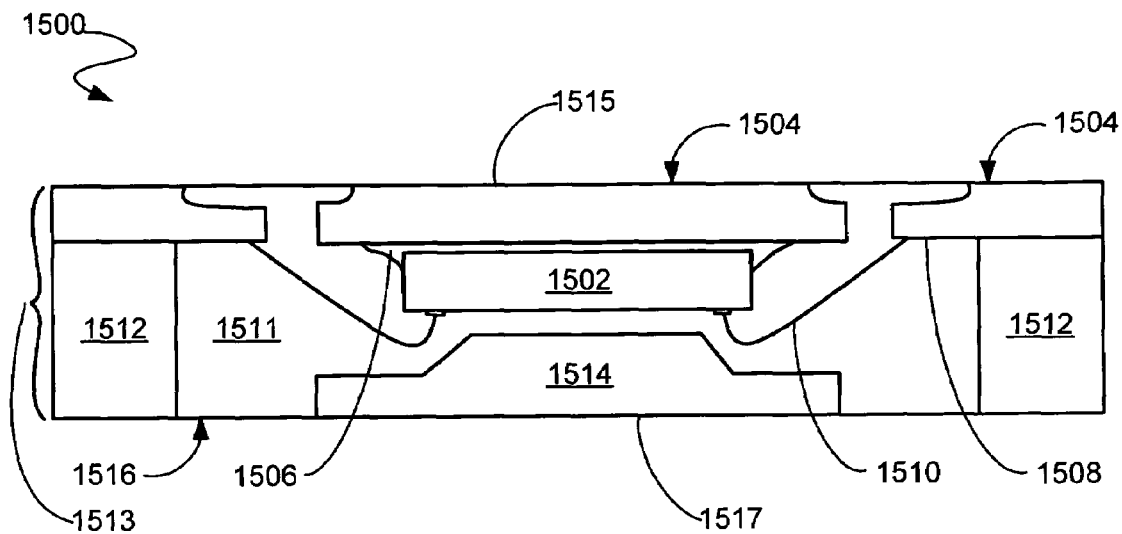
FIG. 15 is a cross sectional view of an inverted mounted integrated circuit package system in accordance with another embodiment of the present invention.

Referring now to FIG. 15, therein is shown a cross sectional view of an inverted mounted integrated circuit package system 1500 in accordance with another embodiment of the present invention. A die 1502 is attached to a first leadframe 1504 with an epoxy 1506. The first leadframe 1504 has leads 1508 which are electrically connected to the die 1502 with wires 1510. An encapsulant space 1511 is formed on the first leadframe 1504 and encloses the die 1502, the epoxy 1506, and the wires 1510. A second leadframe 1512 surrounds the encapsulant space 1511 and is mounted on the first leadframe 1504. The second leadframe 1512 and the first leadframe 1504 form a leadframe structure 1513, having a planar top surface 1515 and a planar bottom surface 1517. A heat sink 1514 is positioned below the die 1502 with at least a portion in the encapsulant space 1511. An encapsulant 1516 in the encapsulant space 1511 encapsulates at least portions of the die 1502, the first leadframe 1504, the second leadframe 1512, the wires 1510, and the heat sink 1514. The encapsulant 1516 is coplanar with the planar top surface 1515 and the planar bottom surface 1517.

The inverted mounted integrated circuit package system 1500 is mounted upside down. Upside down mounting allows attachment of an additional heat sink (not shown) and/or fan (not shown) for additional heat dissipation. By attaching the heat sink and/or fan directly to the planar top surface 1515, heat can flow directly from the die 1502 to the heat sink and/or fan. Thus the inverted mounted integrated circuit package system 1500, more efficiently removes heat than integrated circuit package systems where heat flows through the encapsulant 1516.

Figure 16:
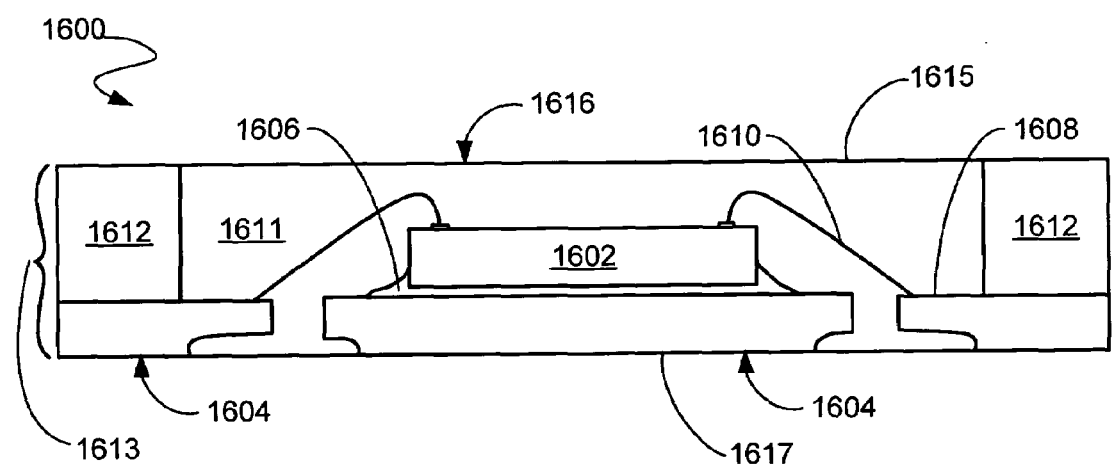
FIG. 16 is a cross sectional view of a lower profile integrated circuit package system in accordance with another embodiment of the present invention.

Referring now to FIG. 16, therein is shown a cross sectional view of a lower profile integrated circuit package system 1600 in accordance with another embodiment of the present invention. A die 1602 is attached to a first leadframe 1604 with an epoxy 1606. The first leadframe 1604 has leads 1608 which are electrically connected to the die 1602 with wires 1610. An encapsulant space 1611 is formed on the first leadframe 1604 and encloses the die 1602, the epoxy 1606, and the wires 1610. A second leadframe 1612 surrounds the encapsulant space 1611 and is mounted on the first leadframe 1604. The second leadframe 1612 and the first leadframe 1604 form a leadframe structure 1613, having a planar top surface 1615 and a planar bottom surface 1617. An encapsulant 1616 in the encapsulant space 1611 encapsulates at least portions of the die 1602, the first leadframe 1604, the second leadframe 1612, and the wires 1610, filling the spaces therebetween. The encapsulant 1616 is coplanar with the planar top surface 1615 and the planar bottom surface 1617.

The lower profile integrated circuit package system 1600 does not have a heat sink above the die 1602 and the height of the second leadframe 1612 has been reduced. Thus the lower profile integrated circuit package system 1600 has a lower profile than integrated circuit package systems containing heat sinks and is used for lower power applications.

Figure 17:
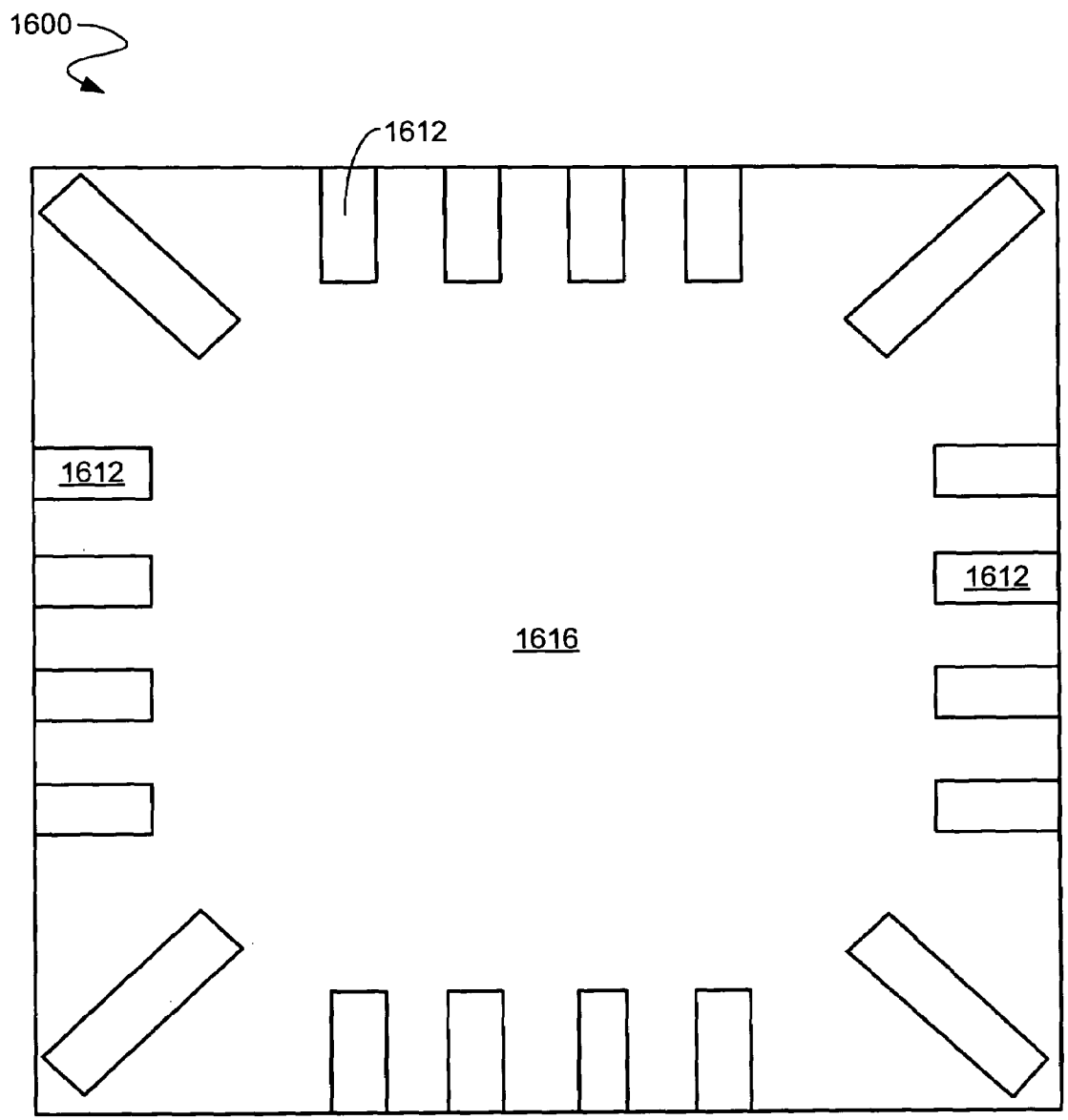
FIG. 17 is a top view of the lower profile integrated circuit package system shown in FIG. 16.

Referring now to FIG. 17, therein is shown a top view of the lower profile integrated circuit package system 1600. An encapsulant 1616 surrounds the sides and bottoms of the second leadframe 1612, leaving its top surface exposed.

Figure 18:
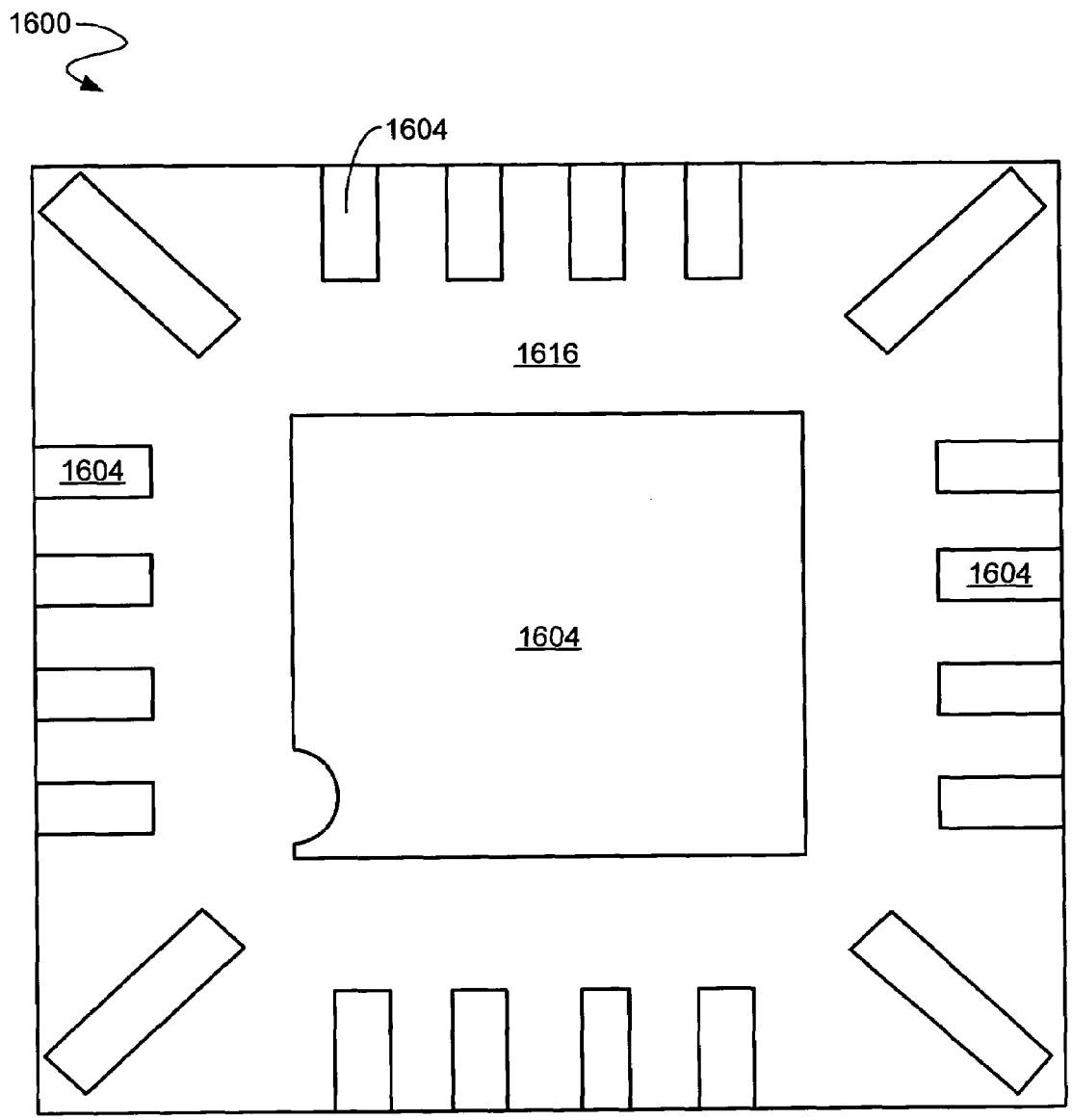
FIG. 18 is a bottom view of the lower profile integrated circuit package system of FIG. 16.

Referring now to FIG. 18, therein is shown a bottom view of the lower profile integrated circuit package system 1600. The encapsulant 1616 surrounds the sides and top of a first leadframe 1604, leaving its bottom surface exposed.

Figure 19:
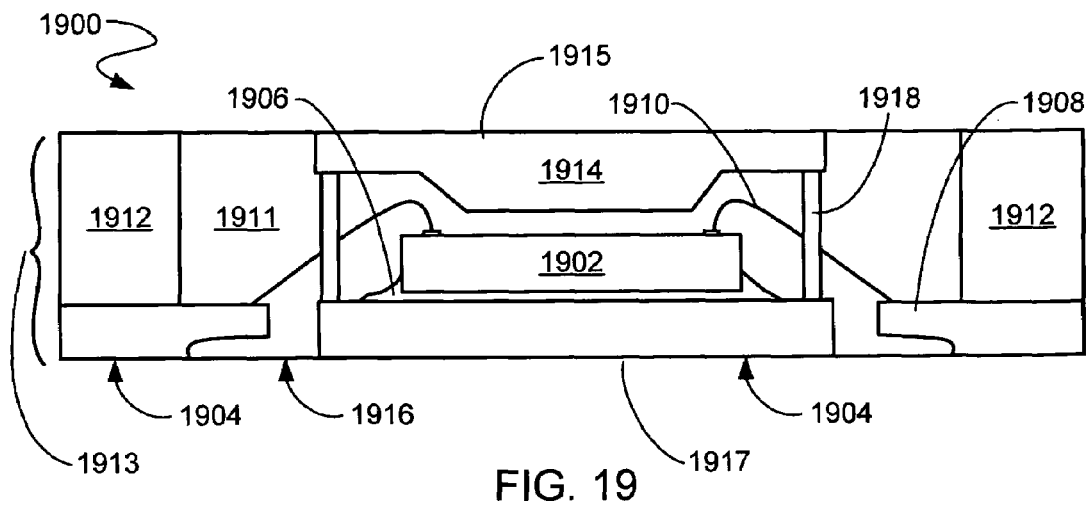
FIG. 19 is a cross sectional view, taken along line 19-19 in FIG. 20, of a corner post clamped integrated circuit package system in accordance with another embodiment of the present invention.
Figure 20:
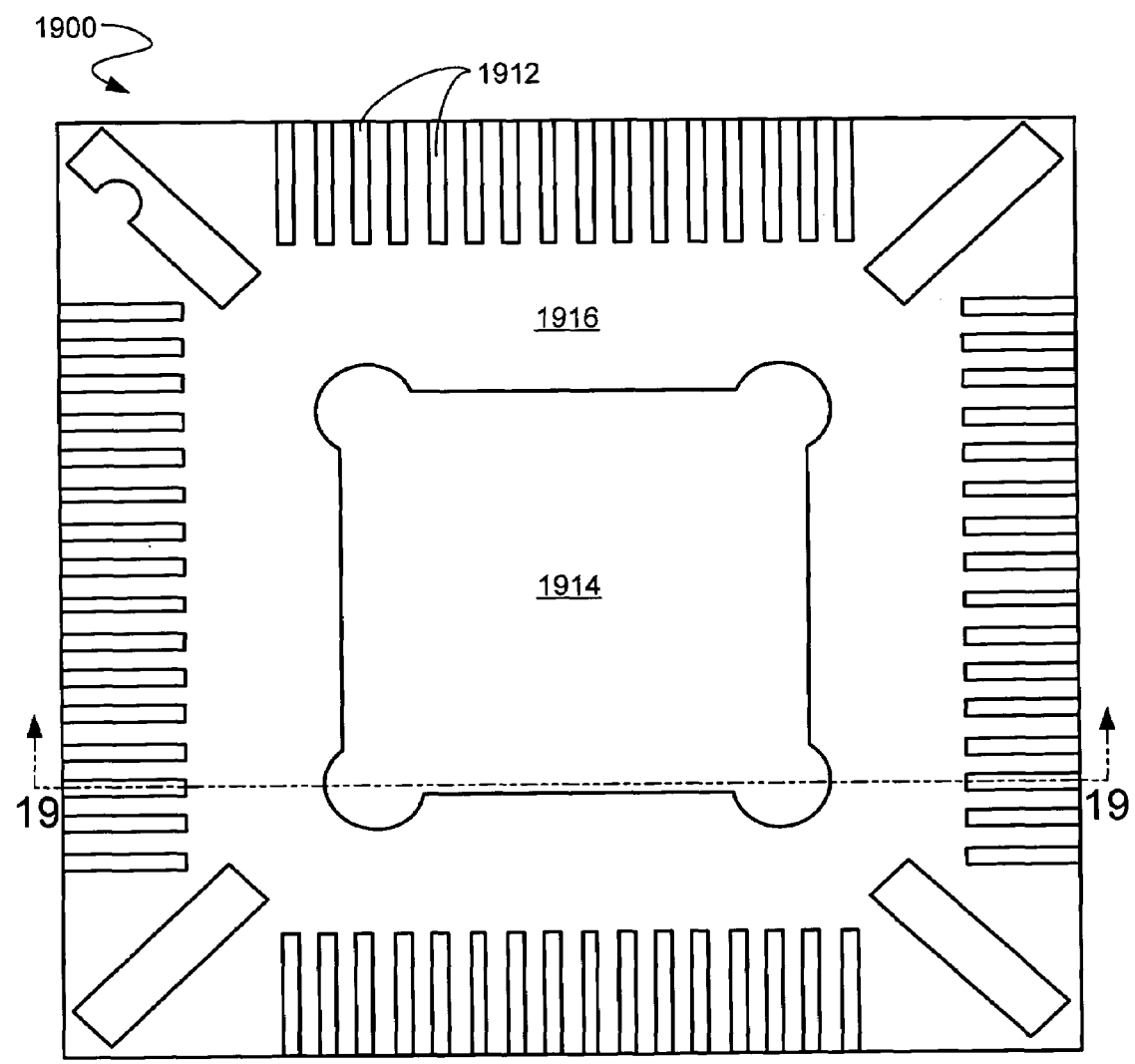
FIG. 20 is a top view of the corner post clamped integrated circuit package system of FIG. 19.

Referring now to FIG. 19, therein is shown a cross sectional view, taken along line 19-19 in FIG. 20, of a corner post clamped integrated circuit package system 1900 in accordance with another embodiment of the present invention. A die 1902 is attached to a first leadframe 1904 with an epoxy 1906. The first leadframe 1904 has leads 1908 which are electrically connected to the die 1902 with wires 1910. An encapsulant space 1911 is formed on the first leadframe 1904 and encloses the die 1902, the epoxy 1906, and the wires 1910. A second leadframe 1912 surrounds the encapsulant space 1911 and is mounted on the first leadframe 1904. The second leadframe 1912 and the first leadframe 1904 form a leadframe structure 1913, having a planar top surface 1915 and a planar bottom surface 1917. Posts 1918 clamp a heat sink 1914 to the first leadframe 1904. An encapsulant 1916 in the encapsulant space 1911 encapsulates at least portions of the die 1902, the first leadframe 1904, the second leadframe 1912, the wires 1910, the heat sink 1914, and the posts 1918, filling the spaces therebetween. The encapsulant 1916 is coplanar with the planar top surface 1915 and the planar bottom surface 1917.

The corner post clamped integrated circuit package system 1900 has the posts 1918 at the corners of the heat sink 1914. The posts 1918 provide further support to the heat sink 1914 and the first leadframe 1904. During encapsulation the posts 1918 assist in preventing separation of the heat sink 1914 and the first leadframe 1904, thus further reducing the formation of mold flash.

Referring now to FIG. 20, therein is shown a top view of the corner post clamped integrated circuit package system 1900. The encapsulant 1916 surrounds the sides and bottoms of the second leadframe 1912 and the heat sink 1914, leaving its top surface exposed.

Figure 21:
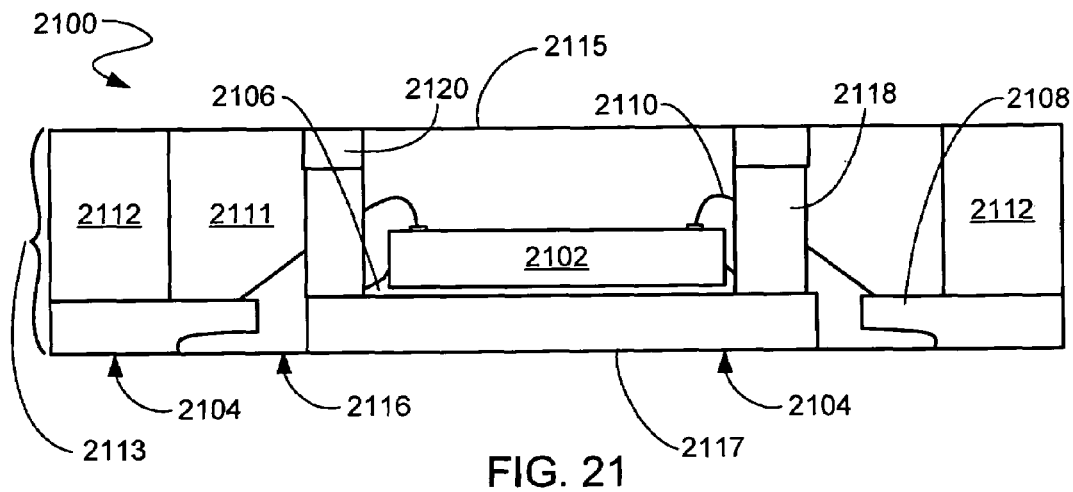
FIG. 21 is a cross sectional view, taken along line 21-21 in FIG. 22, of a corner post clamped top frame integrated circuit package system in accordance with another embodiment of the present invention.
Figure 22:
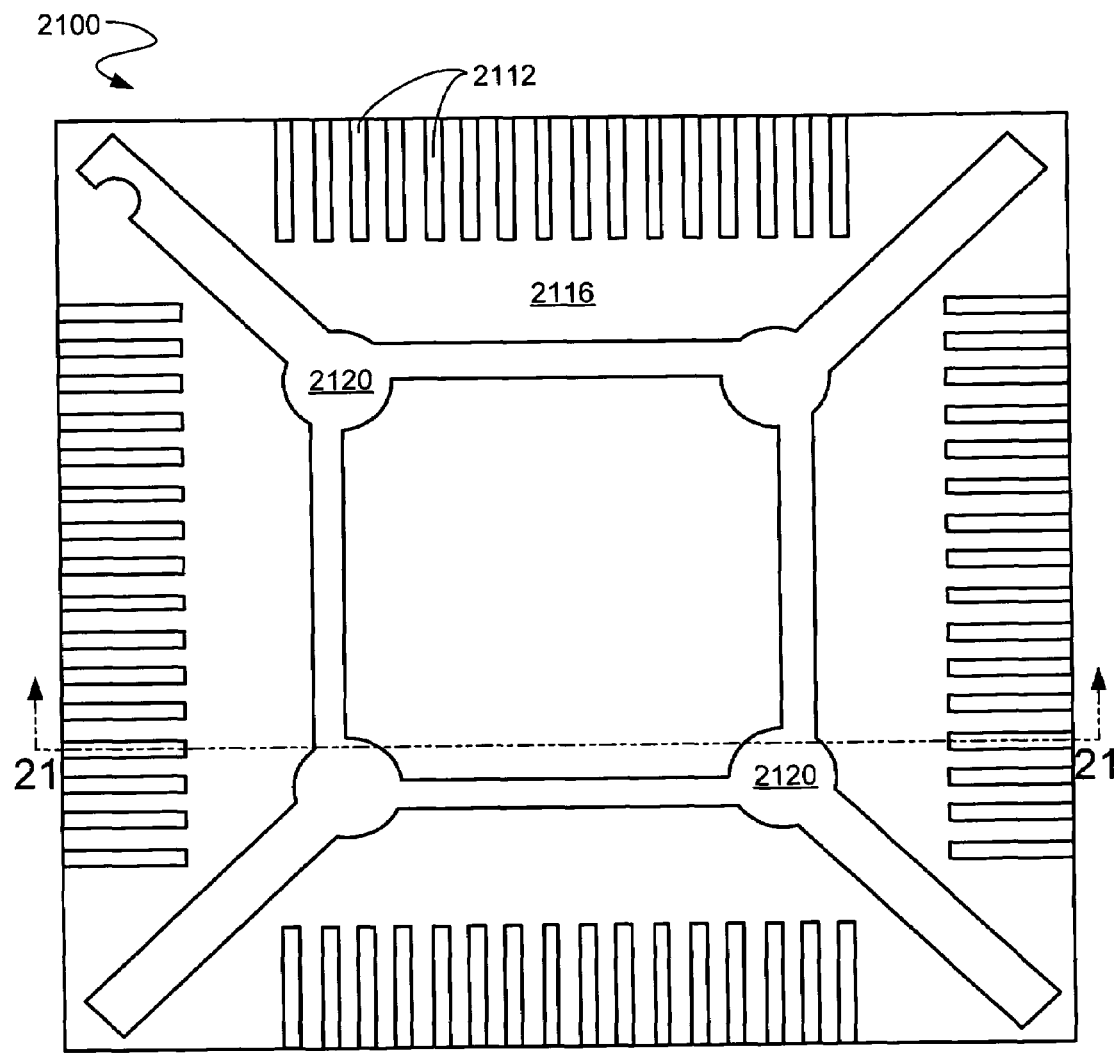
FIG. 22 is a top view of the corner post clamped top frame integrated circuit package system of FIG. 21.

Referring now to FIG. 21, therein is shown a cross sectional view, taken along line 21-21 in FIG. 22, of a corner post clamped top frame integrated circuit package system 2100 in accordance with another embodiment of the present invention. A die 2102 is attached to a first leadframe 2104 with an epoxy 2106. The first leadframe 2104 has leads 2108 which are electrically connected to the die 2102 with wires 2110. An encapsulant space 2111 is formed on the first leadframe 2104 and encloses the die 2102, the epoxy 2106, and the wires 2110. A second leadframe 2112 surrounds the encapsulant space 2111 and is mounted on the first leadframe 2104. The second leadframe 2112 and the first leadframe 2104 form a leadframe structure 2113, having a planar top surface 2115 and a planar bottom surface 2117. Posts 2118 clamp a top frame 2120 to the first leadframe 2104. An encapsulant 2116 in the encapsulant space 2111 encapsulates at least portions of the die 2102, the first leadframe 2104, the second leadframe 2112, the wires 2110, the top frame 2120, and the posts 2118, filling the spaces therebetween. The encapsulant 2116 is coplanar with the planar top surface 2115 and the planar bottom surface 2117.

The corner post clamped top frame integrated circuit package system 2100 has the posts 2118 at the corners of the top frame 2120. The posts 2118 and the top frame 2120 provide further support to the first leadframe 2104, thus further reducing the formation of mold flash.

Referring now to FIG. 22, therein is shown a top view of the corner post clamped top frame integrated circuit package system 2100. The encapsulant 2116 surrounds the sides and bottoms of the second leadframe 2112 and the top frame 2120, leaving its top surface exposed.

Figure 23:
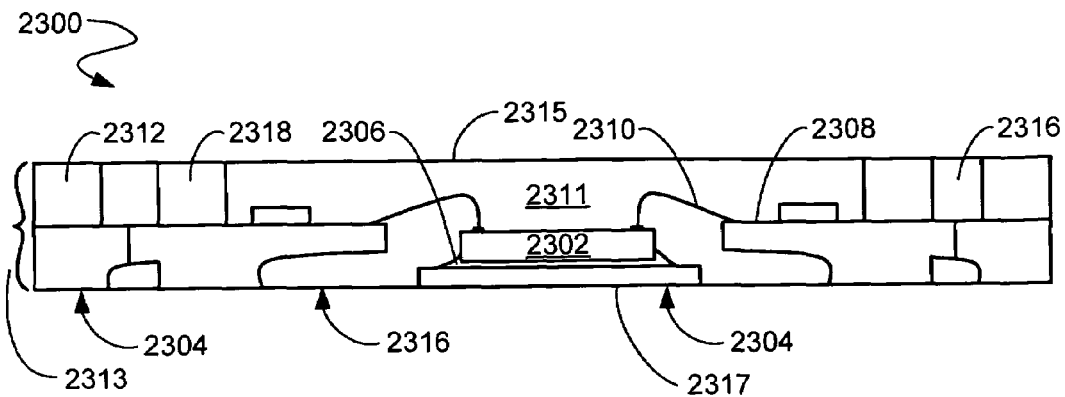
FIG. 23 is a cross sectional view, taken along line 23-23 in FIG. 24, of a multi row integrated circuit package system in accordance with another embodiment of the present invention.
Figure 24:
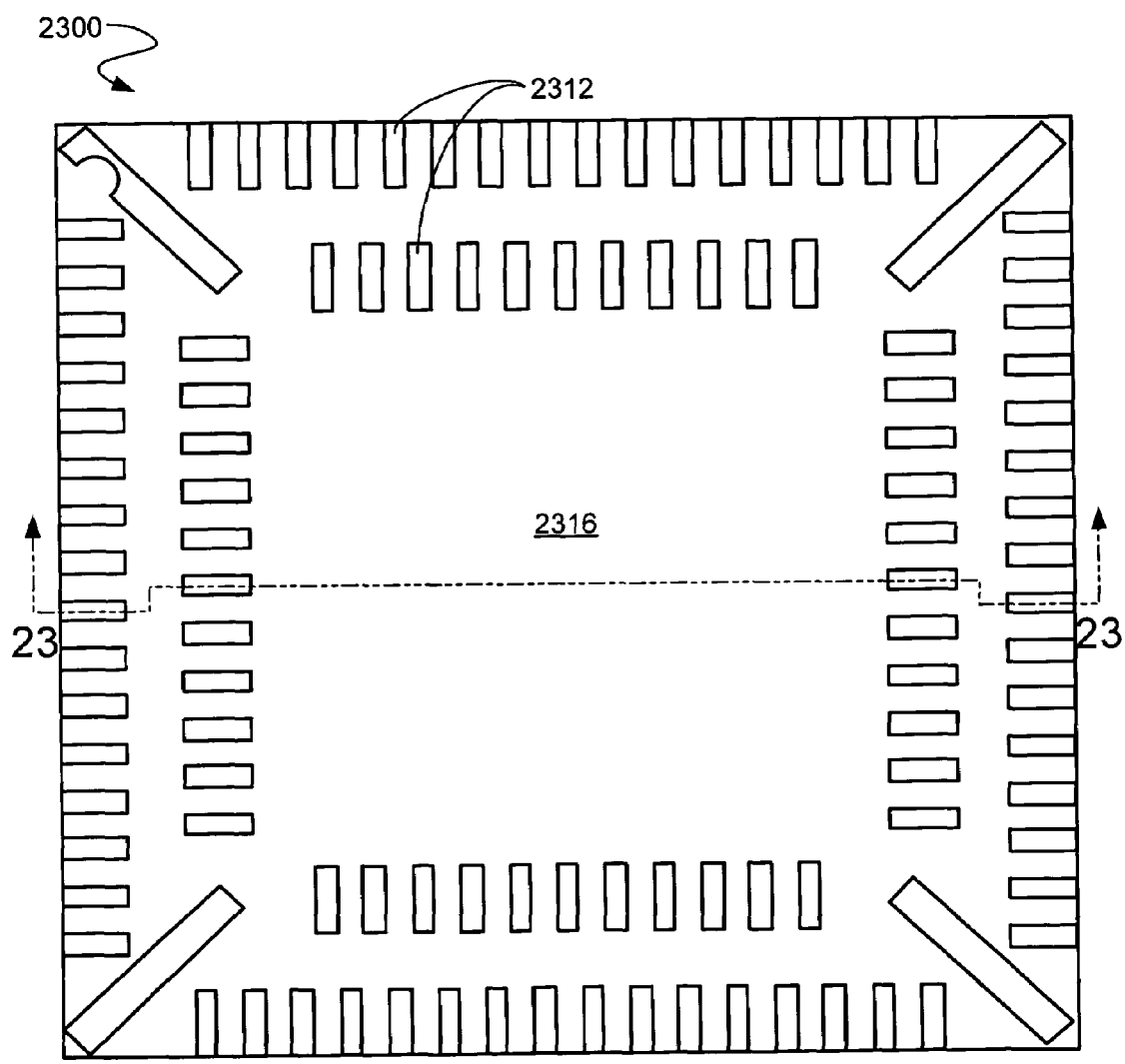
FIG. 24 is a top view of the multi row integrated circuit package system of FIG. 23.

Referring now to FIG. 23, therein is shown a cross sectional view, taken along line 23-23 in FIG. 24, of a multi row integrated circuit package system 2300 in accordance with another embodiment of the present invention. A die 2302 is attached to a first leadframe 2304 with an epoxy 2306. The first leadframe 2304 has leads 2308 which are electrically connected to the die 2302 with wires 2310. An encapsulant space 2311 is formed on the first leadframe 2304 and encloses the die 2302, the epoxy 2306, and the wires 2310. A second leadframe 2312 surrounds the encapsulant space 2311 and is mounted on the first leadframe 2304. The second leadframe 2312 has inner columns 2318. The second leadframe 2312 and the first leadframe 2304 form a leadframe structure 2313, having a planar top surface 2315 and a planar bottom surface 2317. An encapsulant 2316 in the encapsulant space 2311 encapsulates at least portions of the die 2302, the first leadframe 2304, the second leadframe 2312, the wires 2310, and the inner columns 2318, filling the spaces therebetween. The encapsulant 2316 is coplanar with the planar top surface 2315 and the planar bottom surface 2317.

The multi row integrated circuit package system 2300 has the second leadframe 2312 with the inner columns 2318. The inner columns 2318 provide additional support to the first leadframe 2304, thus further reducing the formation of mold flash.

Referring now to FIG. 24, therein is shown a top view of the multi row integrated circuit package system 2300. The encapsulant 2316 surrounds the sides and bottoms of the second leadframe 2312, leaving its top surface exposed.

Figure 25:
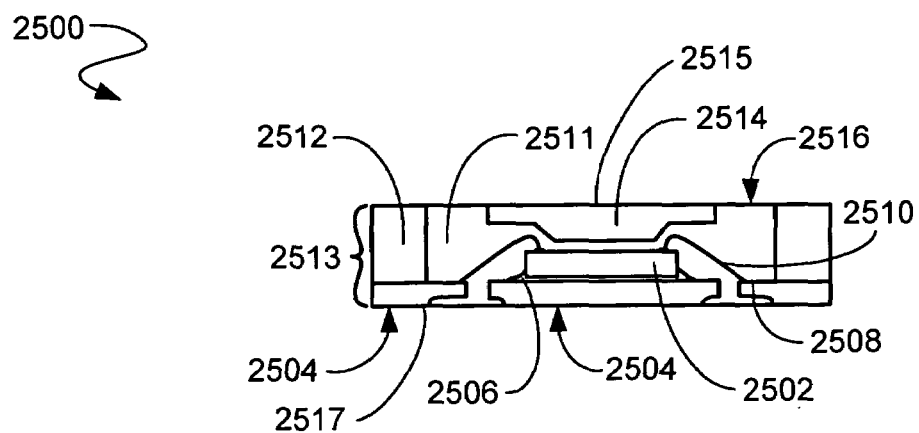
FIG. 25 is a cross sectional view, taken along line 25-25 in FIG. 26, of a dual sided integrated circuit package system in accordance with another embodiment of the present invention.
Figure 26:
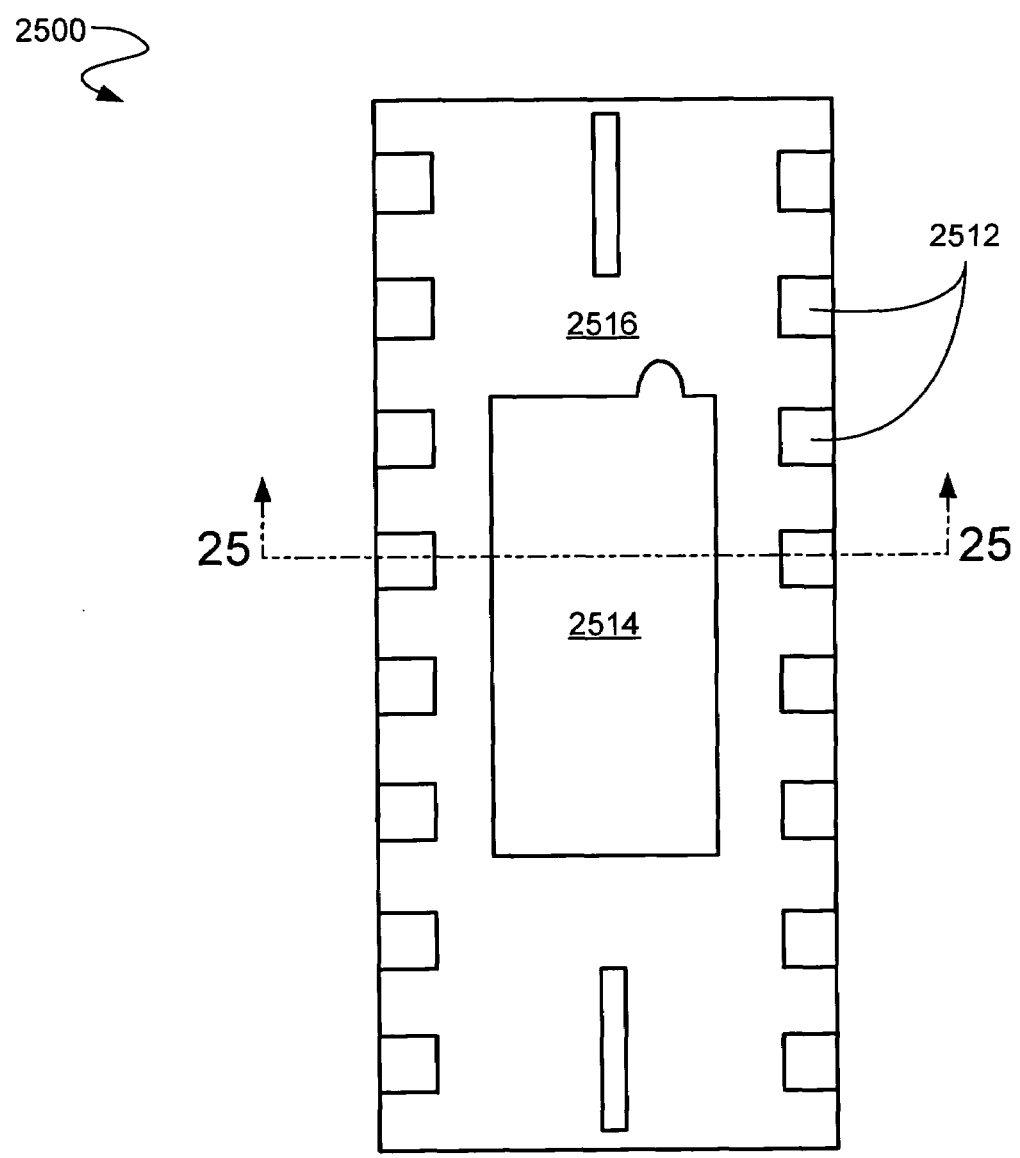
FIG. 26 is a top view of the dual sided integrated circuit package system of FIG. 25.

Referring now to FIG. 25, therein is shown a cross sectional view, taken along line 25-25 in FIG. 26, of a dual sided integrated circuit package system 2500 in accordance with another embodiment of the present invention. A die 2502 is attached to a first leadframe 2504 with an epoxy 2506. The first leadframe 2504 has leads 2508 which are electrically connected to the die 2502 with wires 2510. An encapsulant space 2511 is formed on the first leadframe 2504 and encloses the die 2502, the epoxy 2506, and the wires 2510. The leads 2508 are only on two opposite sides of the die 2502. A second leadframe 2512 surrounds the encapsulant space 2511 and is mounted on the first leadframe 2504. The second leadframe 2512 and the first leadframe 2504 form a leadframe structure 2513, having a planar top surface 2515 and a planar bottom surface 2517. A heat sink 2514 is positioned above the die 2502 with at least a portion in the encapsulant space 2511. An encapsulant 2516 in the encapsulant space 2511 encapsulates at least portions of the die 2502, the first leadframe 2504, the second leadframe 2512, the wires 2510, and the heat sink 2514, filling the spaces therebetween. The encapsulant 2516 is coplanar with the planar top surface 2515 and the planar bottom surface 2517.

Referring now to FIG. 26, therein is shown a top view of the dual sided integrated circuit package system 2500. The encapsulant 2516 surrounds the sides and bottoms of the second leadframe 2512 and the heat sink 2514, leaving its top surface exposed.

Figure 27:
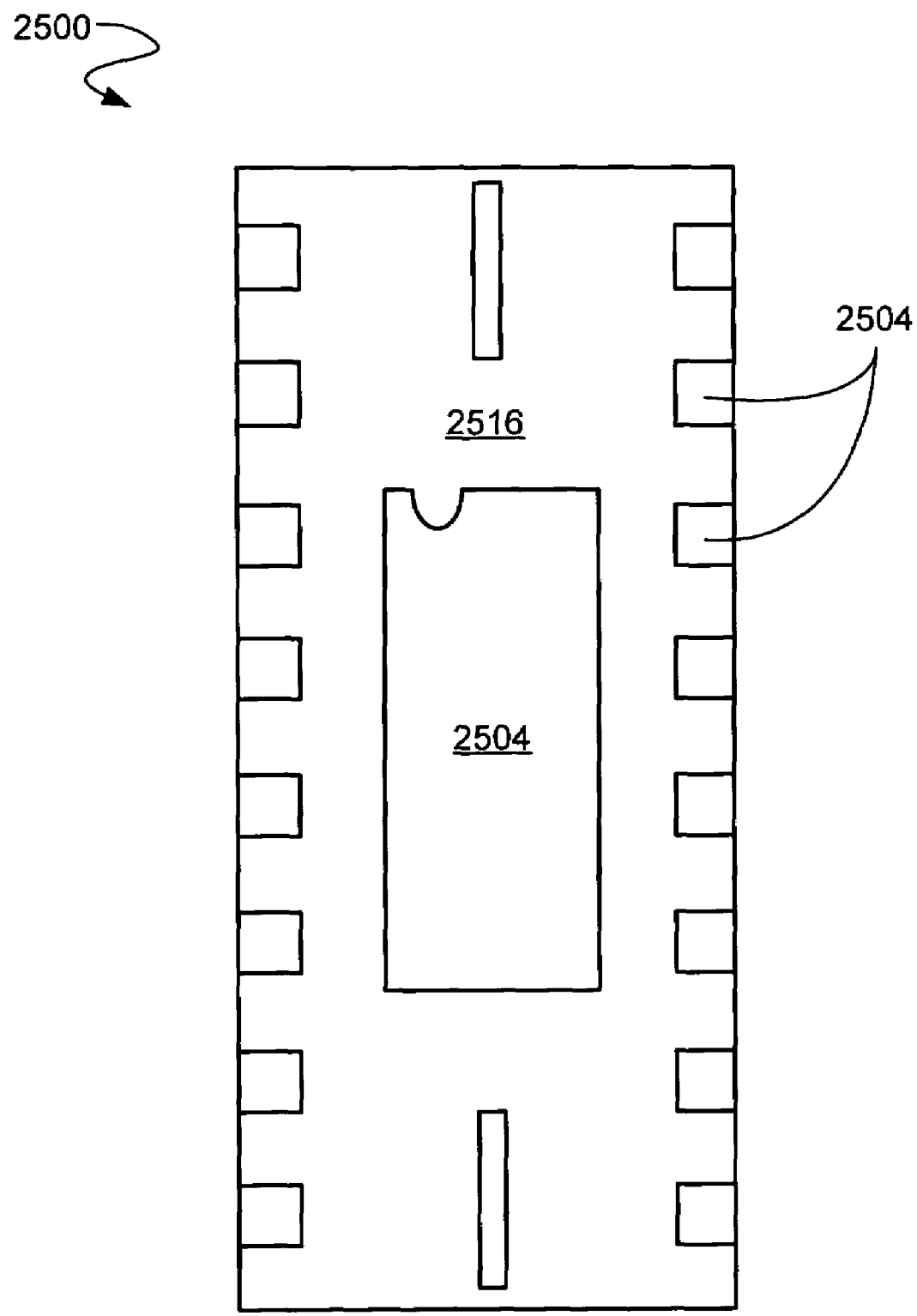
FIG. 27 is a bottom view of the dual sided integrated circuit package system of FIG. 25.

Referring now to FIG. 27, therein is shown a bottom view of the dual sided integrated circuit package system 2500. The encapsulant 2516 surrounds the sides and top of a first leadframe 2504, leaving its bottom surface exposed.

Figure 28:
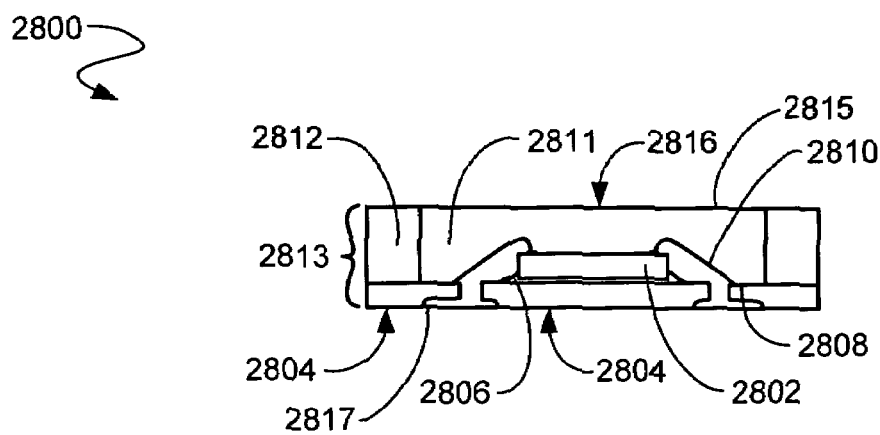
FIG. 28 is a cross sectional view, taken along line 28-28 in FIG. 29, of a dual sided lower profile integrated circuit package system in accordance with another embodiment of the present invention.
Figure 29:
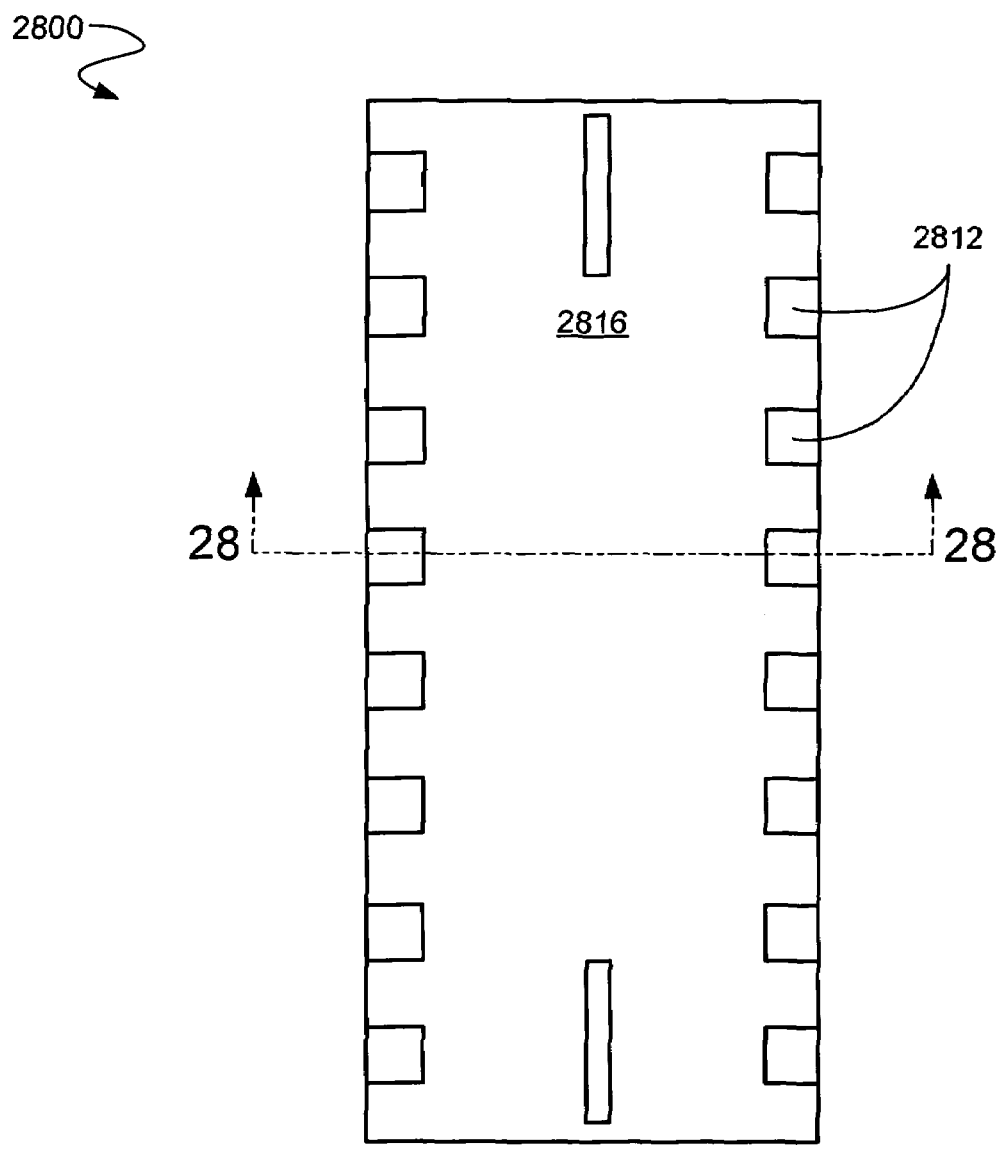
FIG. 29 is a top view of the dual sided lower profile integrated circuit package system of FIG. 28.

Referring now to FIG. 28, therein is shown a cross sectional view, taken along line 28-28 in FIG. 29, of a dual sided lower profile integrated circuit package system 2800 in accordance with another embodiment of the present invention. A die 2802 is attached to a first leadframe 2804 with an epoxy 2806. The first leadframe 2804 has leads 2808 which are electrically connected to the die 2802 with wires 2810. An encapsulant space 2811 is formed on the first leadframe 2804 and encloses the die 2802, the epoxy 2806, and the wires 2810. The leads 2808 are on only two opposite sides of the die 2802. A second leadframe 2812 surrounds the encapsulant space 2811 and is mounted on the first leadframe 2804. The second leadframe 2812 and the first leadframe 2804 form a leadframe structure 2813, having a planar top surface 2815 and a planar bottom surface 2817. An encapsulant 2816 in the encapsulant space 2811 encapsulates at least portions of the die 2802, the first leadframe 2804, the second leadframe 2812, and the wires 2810, filling the spaces therebetween. The encapsulant 2816 is coplanar with the planar top surface 2815 and the planar bottom surface 2817.

The dual sided lower profile integrated circuit package system 2800 does not have a heat sink above the die 2802. Thus the dual sided lower profile integrated circuit package system 2800 has a lower profile than integrated circuit package systems containing heat sinks and is used for lower power applications.

Referring now to FIG. 29, therein is shown a top view of the dual sided lower profile integrated circuit package system 2800. The encapsulant 2816 surrounds the sides and bottoms of the second leadframe 2812, leaving its top surface exposed.

Figure 30:
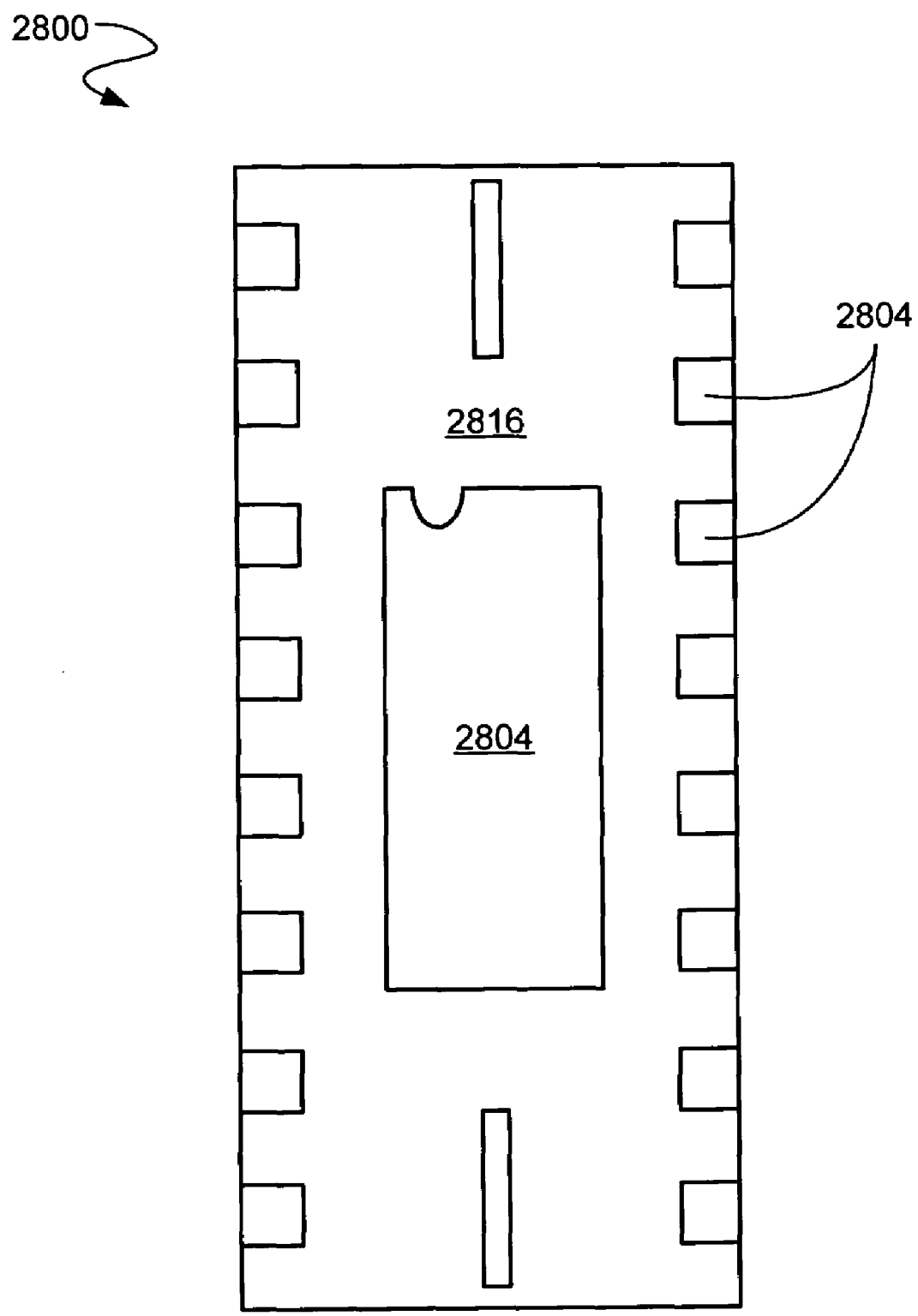
FIG. 30 is a bottom view of the dual sided lower profile integrated circuit package system of FIG. 28.

Referring now to FIG. 30, therein is shown a bottom view of the dual sided lower profile integrated circuit package system 2800. The encapsulant 2816 surrounds the sides and top of the first leadframe 2804, leaving its bottom surface exposed.

Figure 31:
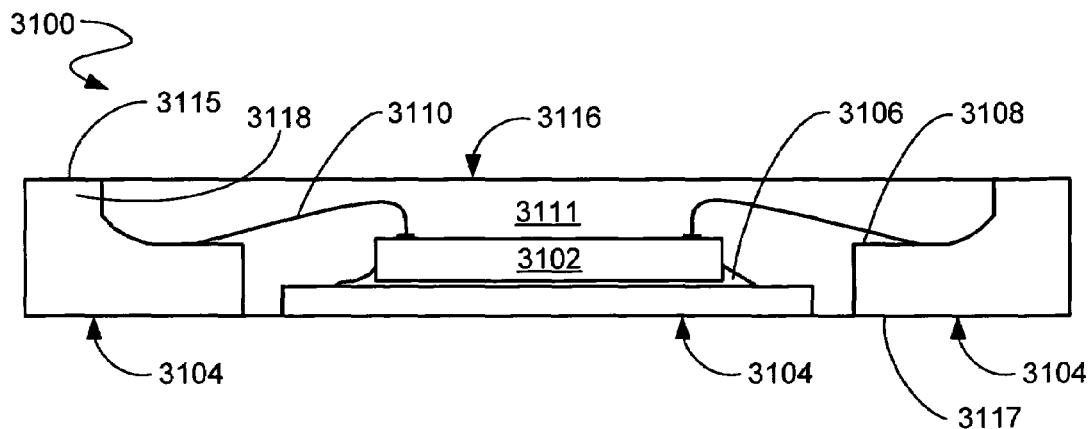
FIG. 31 is a cross sectional view of an ultra lower profile integrated circuit package system in accordance with another embodiment of the present invention.

Referring now to FIG. 31, therein is shown a cross sectional view of an ultra lower profile integrated circuit package system 3100 in accordance with another embodiment of the present invention. A die 3102 is attached to a first leadframe 3104 with an epoxy 3106. The leadframe structure comprises a first leadframe 3104 has raised sides 3118, a planar top surface 3115, and a planar bottom surface 3117. The raised sides 3118 take the place of the second leadframe 1612 (FIG. 16) and surround an encapsulant space 3111. The first leadframe 3104 has leads 3108 which are electrically connected to the die 3102 with wires 3110. The encapsulant space 3111, formed on the first leadframe 3104, encloses the die 3102, the epoxy 3106, and the wires 3110. An encapsulant 3116 in the encapsulant space 3111 encapsulates at least portions of the die 3102, the first leadframe 3104, and the wires 3110, filling the spaces therebetween. The encapsulant 3116 is coplanar with the planar top surface 3115 and the planar bottom surface 3117.

The ultra lower profile integrated circuit package system 3100 does not have a heat sink above the die 3102 and does not have a second leadframe. The raised sides 3118 of the first leadframe 3104 perform the same function as a second leadframe, but with a lower profile. Thus the ultra lower profile integrated circuit package system 3100 has a lower profile than integrated circuit package systems containing heat sinks and second leadframes and is used for lower power applications.

Figure 32:
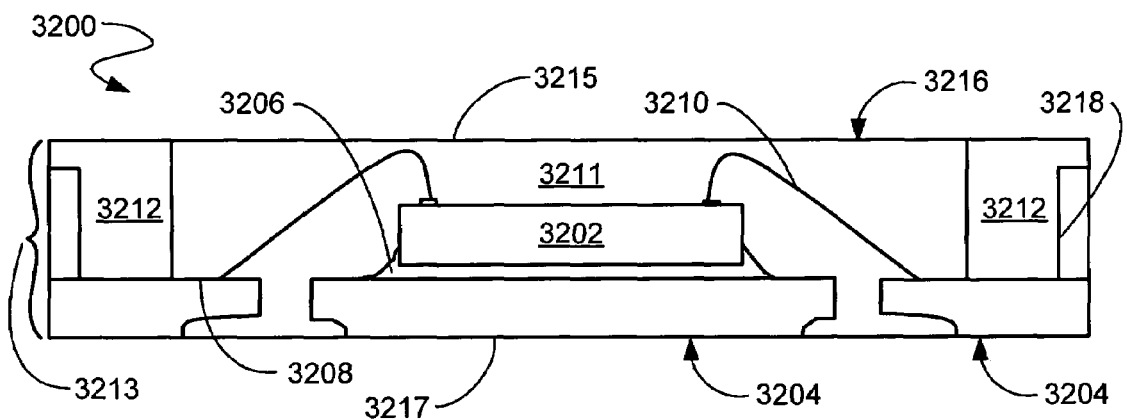
FIG. 32 is a cross sectional view of a reduced cutting area of second leadframe integrated circuit package system in accordance with another embodiment of the present invention.

Referring now to FIG. 32, therein is shown a cross sectional view of a reduced cutting area of second leadframe integrated circuit package system 3200 in accordance with another embodiment of the present invention. A die 3202 is attached to a first leadframe 3204 with an epoxy 3206. A second leadframe 3212 is mounted on the first leadframe 3204. The second leadframe 3212 has undercut sides 3218. The second leadframe 3212 and the first leadframe 3204 form a leadframe structure 3213, having a planar top surface 3215 and a planar bottom surface 3217. The first leadframe 3204 has leads 3208 which are electrically connected to the die 3202 with wires 3210. An encapsulant space 3211 is formed on the first leadframe 3204 and encloses the die 3202, the epoxy 3206, and the wires 3210. An encapsulant 3216 in the encapsulant space 3211 encapsulates at least portions of the die 3202, the first leadframe 3204, and the wires 3210, filling the spaces therebetween. The encapsulant 3216 is coplanar with the planar top surface 3215 and the planar bottom surface 3217.

The reduced cutting area of second leadframe integrated circuit package system 3200 has undercut sides 3218. Thus, during singulation, there is less metal to cut. Therefore, the undercut sides 3218 increase the life and reliability of singulation equipment such as saw singulation equipment and punch singulation equipment.

Figure 33:
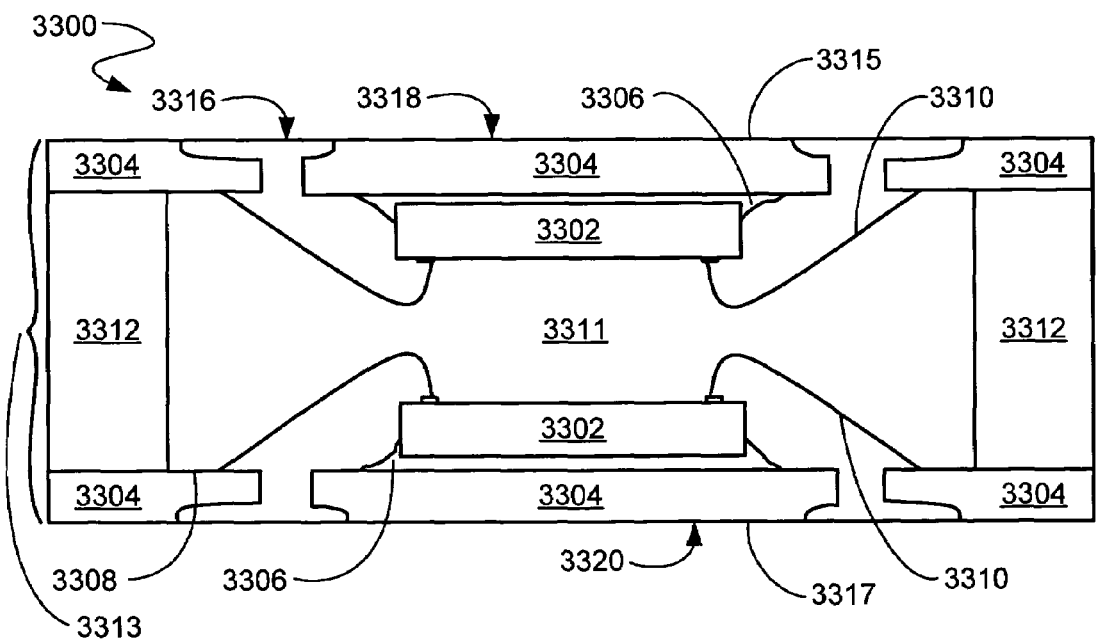
FIG. 33 is a cross sectional view of a flip stacked integrated circuit package system in accordance with another embodiment of the present invention.

Referring now to FIG. 33, therein is shown a cross sectional view of a flip stacked integrated circuit package system 3300, in accordance with another embodiment of the present invention. Dies 3302 are attached to respective first leadframes 3304 with an epoxy 3306. The first leadframes 3304 have respective leads 3308 that are electrically connected respectively to the dies 3302 with corresponding wires 3310. An encapsulant space 3311 is formed on the first leadframes 3304 and encloses the dies 3302, the epoxy 3306, and the wires 3310. The respective dies 3302, the first leadframes 3304, and the wires 3310 form a first device 3318 and a second device 3320, respectively. A second leadframe 3312 is mounted between the first leadframes 3304. The second leadframe 3312 and the first leadframes 3304 form a leadframe structure 3313, having a planar top surface 3315 and a planar bottom surface 3317. The second leadframe 3312 allows the first device 3318 to be flipped and stacked on the second device 3320. An encapsulant 3316 in the encapsulant space 3311 encapsulates at least portions of the first device 3318 and the second device 3320, filling the spaces therebetween and forming the flip stacked integrated circuit package system 3300. The encapsulant 3316 is coplanar with the planar top surface 3315 and the planar bottom surface 3317.

The flip stacked integrated circuit package system 3300 does not have a heat sink between the dies 3302. Thus the flip stacked integrated circuit package system 3300 has a lower profile than stacked integrated circuit package systems containing heat sinks and is used for lower power applications.

Figure 34:
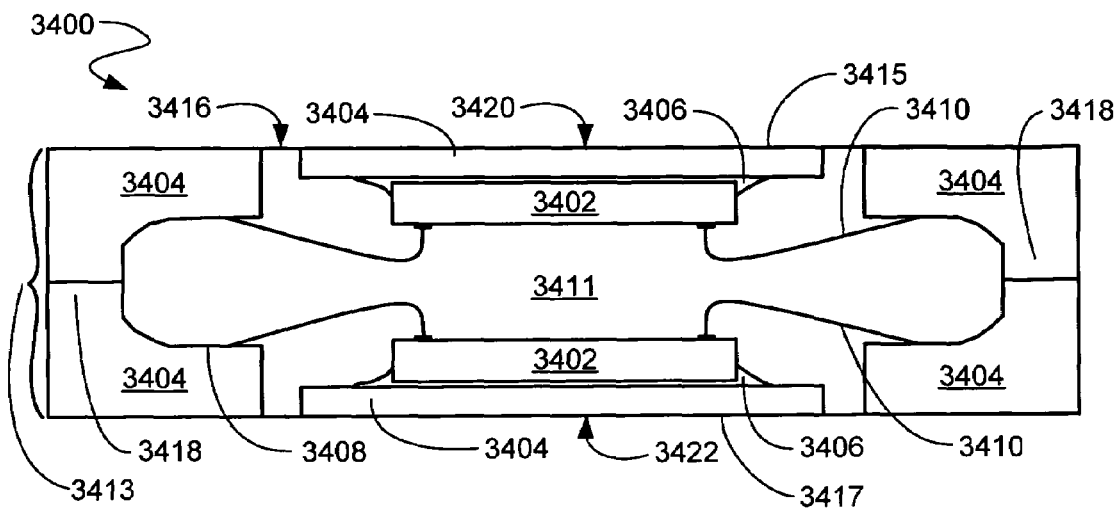
FIG. 34 is a cross sectional view of a flipped stacked lower profile integrated circuit package system in accordance with another embodiment of the present invention.

Referring now to FIG. 34, therein is shown a cross sectional view of a flipped stacked lower profile integrated circuit package system 3400, in accordance with another embodiment of the present invention. Dies 3402 are attached to respective first leadframes 3404 with an epoxy 3406. The first leadframes 3404 have respective leads 3408, which are electrically connected respectively to the dies 3402 with wires 3410. An encapsulant space 3411 is formed on the first leadframes 3404 and encloses the dies 3402, the epoxy 3406, and the wires 3410. The respective dies 3402, the first leadframes 3404, and the wires 3410 form a first device 3420 and a second device 3422. The first leadframes 3404 have raised sides 3418, a planar top surface 3415, and a planar bottom surface 3417. The raised sides 3418 take the place of the second leadframe 3312 (FIG. 33). The raised sides 3418 allow the first device 3420 to be flipped and stacked on the second device 3422. An encapsulant 3416 in the encapsulant space 3411 encapsulates at least portions of the first device 3420 and the second device 3422, filling the spaces therebetween and forming the flipped stacked lower profile integrated circuit package system 3400. The encapsulant 3416 is coplanar with the planar top surface 3415 and the planar bottom surface 3417.

The flipped stacked lower profile integrated circuit package system 3400 does not have a heat sink between the dies 3402 and does not have a second leadframe. The raised sides 3418 of the first leadframes 3404 perform the same function as the second leadframe 3312 (FIG. 33), but with a lower profile. Thus the flipped stacked lower profile integrated circuit package system 3400 has a lower profile than flip stacked integrated circuit package systems containing second leadframes and is used for lower power applications.

Figure 35:
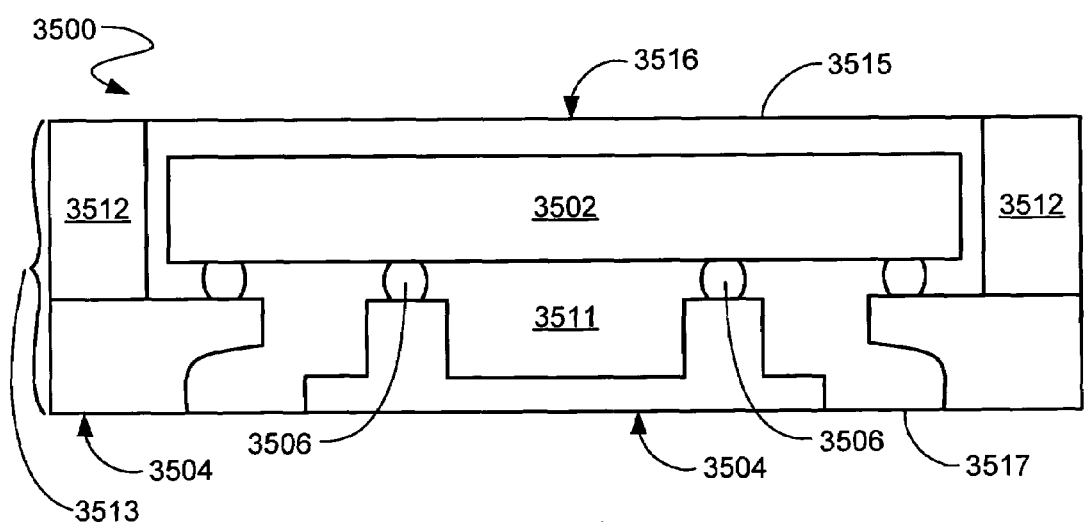
FIG. 35 is a cross sectional view of a flip chip interconnect integrated circuit package system in accordance with another embodiment of the present invention.

Referring now to FIG. 35, therein is shown a cross sectional view of a flip chip interconnect integrated circuit package system 3500 in accordance with another embodiment of the present invention. A die 3502 is attached to a first leadframe 3504 with solder bumps 3506. The solder bumps 3506 electrically connect the die 3502 with the first leadframe 3504. An encapsulant space 3511 is formed on the first leadframe 3504 and encloses the die 3502 and the solder bumps 3506. A second leadframe 3512 surrounds the encapsulant space 3511 and is mounted on the first leadframe 3504. The second leadframe 3512 and the first leadframe 3504 form a leadframe structure 3513, having a planar top surface 3515 and a planar bottom surface 3517. An encapsulant 3516 in the encapsulant space 3511 encapsulates at least portions of the die 3502, the first leadframe 3504, the second leadframe 3512, and the solder bumps 3506, filling the spaces therebetween. The encapsulant 3516 is coplanar with the planar top surface 3515 and the planar bottom surface 3517.

Figure 36:
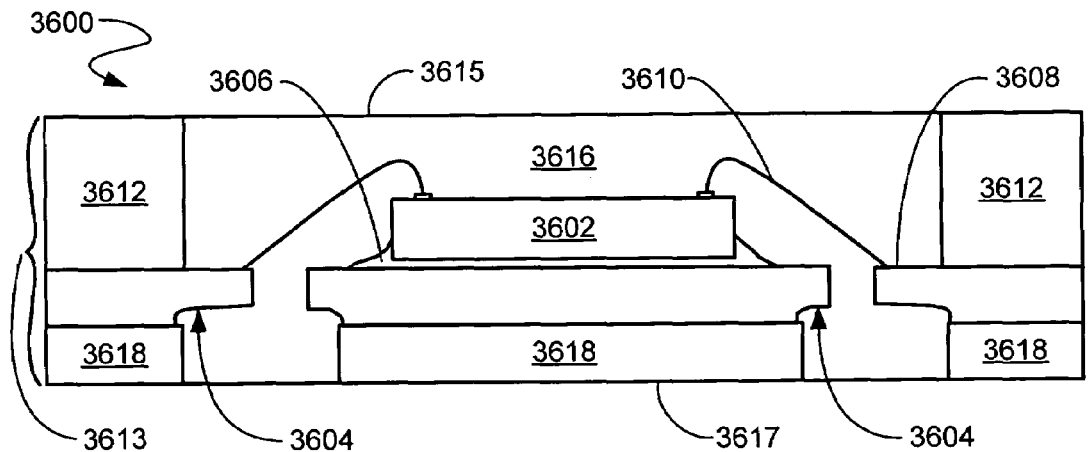
FIG. 36 is a cross sectional view of a heat transfer through board integrated circuit package system in accordance with another embodiment of the present invention.

Referring now to FIG. 36, therein is shown a cross sectional view of a heat transfer through board integrated circuit package system 3600 in accordance with another embodiment of the present invention. A die 3602 is attached to a first leadframe 3604 with an epoxy 3606. The first leadframe 3604 has leads 3608 which are electrically connected to the die 3602 with wires 3610. An encapsulant space 3611 is formed on the first leadframe 3604 and encloses the die 3602, the epoxy 3606, and the wires 3610. A second leadframe 3612 surrounds the encapsulant space 3611 and is mounted on the first leadframe 3604. A third leadframe 3618 is below the first leadframe 3604 with at least a portion in the encapsulant space 3611. The third leadframe 3618, the second leadframe 3612 and the first leadframe 3604 form a leadframe structure 3613, having a planar top surface 3615 and a planar bottom surface 3617. An encapsulant 3616 in the encapsulant space 3611 encapsulates at least portions of the die 3602, the first leadframe 3604, the second leadframe 3612, the wires 3610, and the third leadframe 3618, filling the spaces therebetween. The encapsulant 3616 is coplanar with the planar top surface 3615 and the planar bottom surface 3617.

The heat transfer through board integrated circuit package system 3600 is used for high power applications. The third leadframe 3618 acts as a heat sink, allowing heat to be transferred more readily through a printed circuit board (not shown) when mounted thereon.

Figure 37:
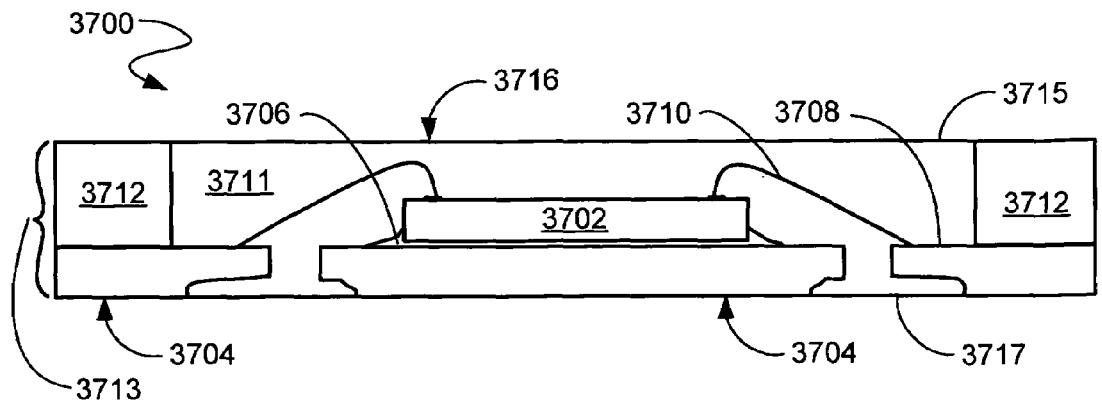
FIG. 37 is a cross sectional view of a thinner profile integrated circuit package system in accordance with another embodiment of the present invention.

Referring now to FIG. 37, therein is shown a cross sectional view of a thinner profile integrated circuit package system 3700 in accordance with another embodiment of the present invention. A die 3702 is attached to a first leadframe 3704 with an epoxy 3706. The first leadframe 3704 has leads 3708 which are electrically connected to the die 3702 with wires 3710. An encapsulant space 3711 is formed on the first leadframe 3704 and encloses the die 3702, the epoxy 3706, and the wires 3710. A second leadframe 3712 surrounds the encapsulant space 3711 and is mounted on the first leadframe 3704. The second leadframe 3712 and the first leadframe 3704 form a leadframe structure 3713, having a planar top surface 3715 and a planar bottom surface 3717. An encapsulant 3716 in the encapsulant space 3711 encapsulates at least portions of the die 3702, the first leadframe 3704, the second leadframe 3712, and the wires 3710, filling the spaces therebetween. The encapsulant 3716 is coplanar with the planar top surface 3715 and the planar bottom surface 3717.

The thinner profile integrated circuit package system 3700 does not have a heat sink above the die 3702. In addition, the thickness of the first leadframe 3704, the second leadframe 3712, the die 3702, and the epoxy 3706 is reduced. Furthermore, a low loop height of the wires 3710 is used. Thus the thinner profile integrated circuit package system 3700 has a lower profile than the lower profile integrated circuit package system 3000 (FIG. 30) and is used for lower power applications.

Figure 38:
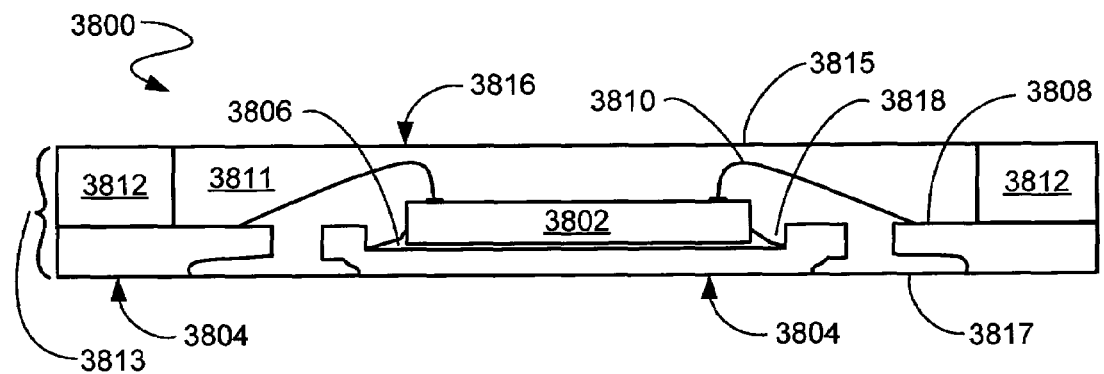
FIG. 38 is a cross sectional view of an ultra thinner profile integrated circuit package system in accordance with another embodiment of the present invention.

Referring now to FIG. 38, therein is shown a cross sectional view of an ultra thinner profile integrated circuit package system 3800 in accordance with another embodiment of the present invention. A trench 3818 is etched in a first leadframe 3804. A die 3802 is attached in the trench 3818 of the first leadframe 3804 with an epoxy 3806. The first leadframe 3804 has leads 3808 which are electrically connected to the die 3802 with wires 3810. An encapsulant space 3811 is formed on the first leadframe 3804 and encloses the die 3802, the epoxy 3806, and the wires 3810. A second leadframe 3812 surrounds the encapsulant space 3811 and is mounted on the first leadframe 3804. The second leadframe 3812 and the first leadframe 3804 form a leadframe structure 3813, having a planar top surface 3815 and a planar bottom surface 3817. An encapsulant 3816 in the encapsulant space 3811 encapsulates at least portions of the die 3802, the first leadframe 3804, the second leadframe 3812, and the wires 3810, filling the spaces therebetween. The encapsulant 3816 is coplanar with the planar top surface 3815 and the planar bottom surface 3817.

The ultra thinner profile integrated circuit package system 3800 does not have a heat sink above the die 3802. In addition, the thickness of the first leadframe 3804, the second leadframe 3812, the die 3802, and the epoxy 3806 is reduced. The height of the die 3802 and the wires 3810 is further reduced with the trench 3818. Furthermore, the loop height of the wires 3810 is reduced. Thus the ultra thinner profile integrated circuit package system 3800 has a lower profile than the lower profile integrated circuit package system 1600 (FIG. 16) and the thinner profile integrated circuit package system 3700 (FIG. 37) and is used for lower power applications.

Figure 39:
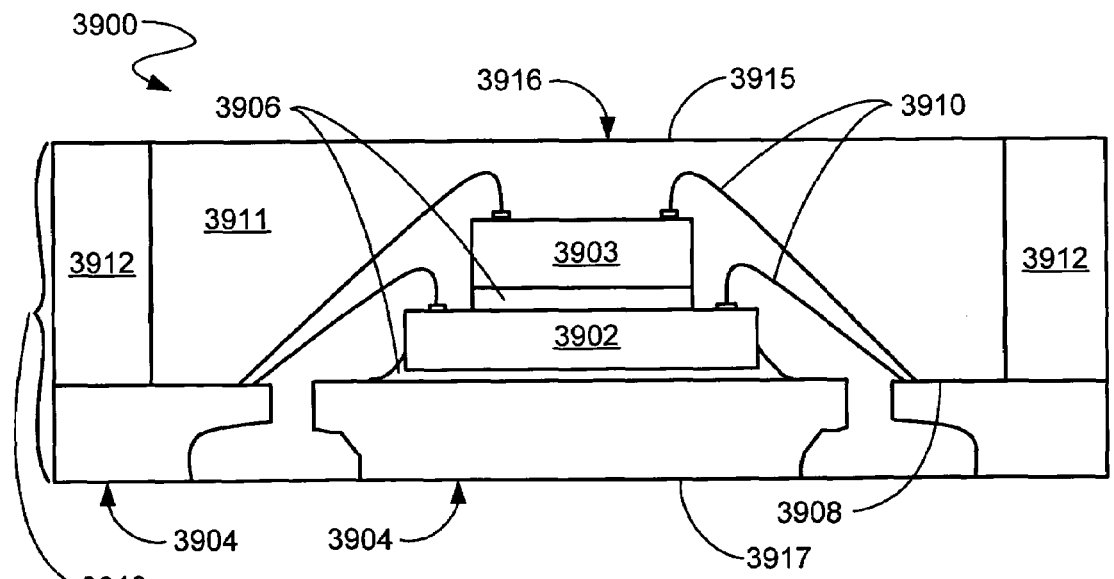
FIG. 39 is a cross sectional view of a die stacked integrated circuit package system in accordance with another embodiment of the present invention.

Referring now to FIG. 39, therein is shown a cross sectional view of a die stacked integrated circuit package system 3900 in accordance with another embodiment of the present invention. A first die 3902 is attached to a first leadframe 3904 with an epoxy 3906. A second die 3903 is attached to the first die 3902 with the epoxy 3906. The first leadframe 3904 has leads 3908 that are electrically connected respectively to the first die 3902 and the second die 3903 with wires 3910. An encapsulant space 3911 is formed on the first leadframe 3904 and encloses the first die 3902, the second die 3903, the epoxy 3906, and the wires 3910. A second leadframe 3912 surrounds the encapsulant space 3911 and is mounted on the first leadframe 3904. The second leadframe 3912 and the first leadframe 3904 form a leadframe structure 3913, having a planar top surface 3915 and a planar bottom surface 3917. An encapsulant 3916 in the encapsulant space 3911 encapsulates at least portions of the first die 3902, the second die 3903, the first leadframe 3904, the second leadframe 3912 and the wires 3910, filling the spaces therebetween. The encapsulant 3916 is coplanar with the planar top surface 3915 and the planar bottom surface 3917.

Figure 40:
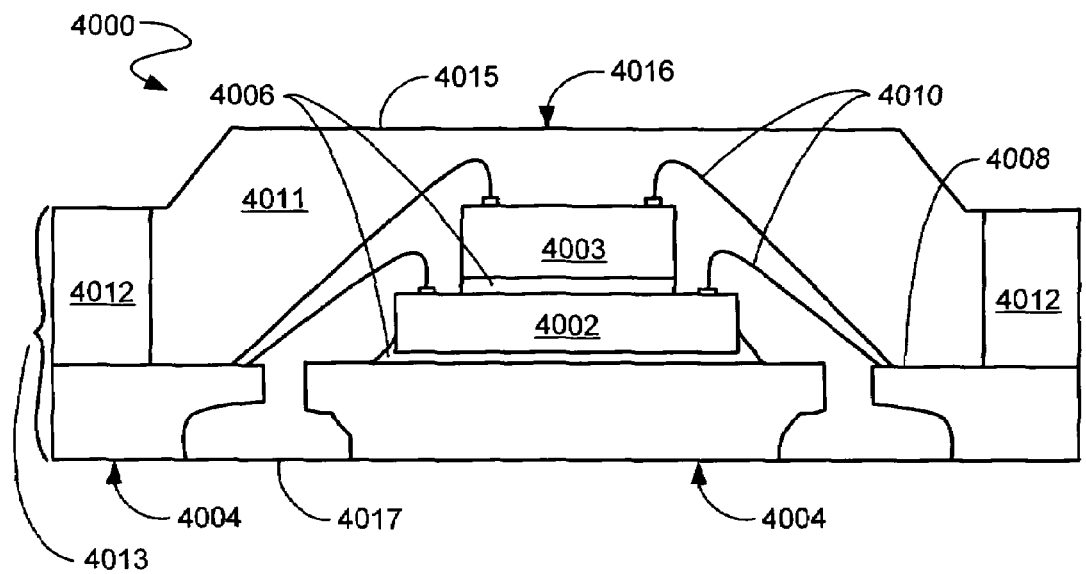
FIG. 40 is a cross sectional view of a die stacked recessed integrated circuit package system in accordance with another embodiment of the present invention.

Referring now to FIG. 40, therein is shown a cross sectional view of a die stacked recessed integrated circuit package system 4000 in accordance with another embodiment of the present invention. Two mold halves 4001 are shown with the upper mold half 4001 having a mold cavity. A first die 4002 is attached to a first leadframe 4004 with an epoxy 4006. A second die 4003 is attached to the first die 4002 with the epoxy 4006. The first leadframe 4004 has leads 4008 that are electrically connected respectively to the first die 4002 and the second die 4003 with wires 4010. An encapsulant space 4011 is formed on the first leadframe 4004 and encloses the first die 4002, the second die 4003, the epoxy 4006, and the wires 4010. A second leadframe 4012 surrounds the encapsulant space 4011 and is mounted on the first leadframe 4004. The second leadframe 4012 is shorter than an encapsulant 4016. The second leadframe 4012 and the first leadframe 4004 form a leadframe structure 4013, having a planar top surface 4015 and a planar bottom surface 4017. The encapsulant 4016 in the encapsulant space 4011 encapsulates at least a portion of the first die 4002, the second die 4003, the first leadframe 4004, the second leadframe 4012, and the wires 4010, filling the spaces therebetween. For purposes of the present invention, the encapsulant space 4011 is predominantly within the first and second leadframes 4004 and 4012, which is defined to mean that all or less than half the height and half the volume of the encapsulant 4016, which fills the encapsulant space 4011, will be outside the first and second leadframes 4004 and 4012. Thus, it is possible for one or both of the mold halves for molding the encapsulant 4016 to be flat or to contain a cavity.

Figure 41:
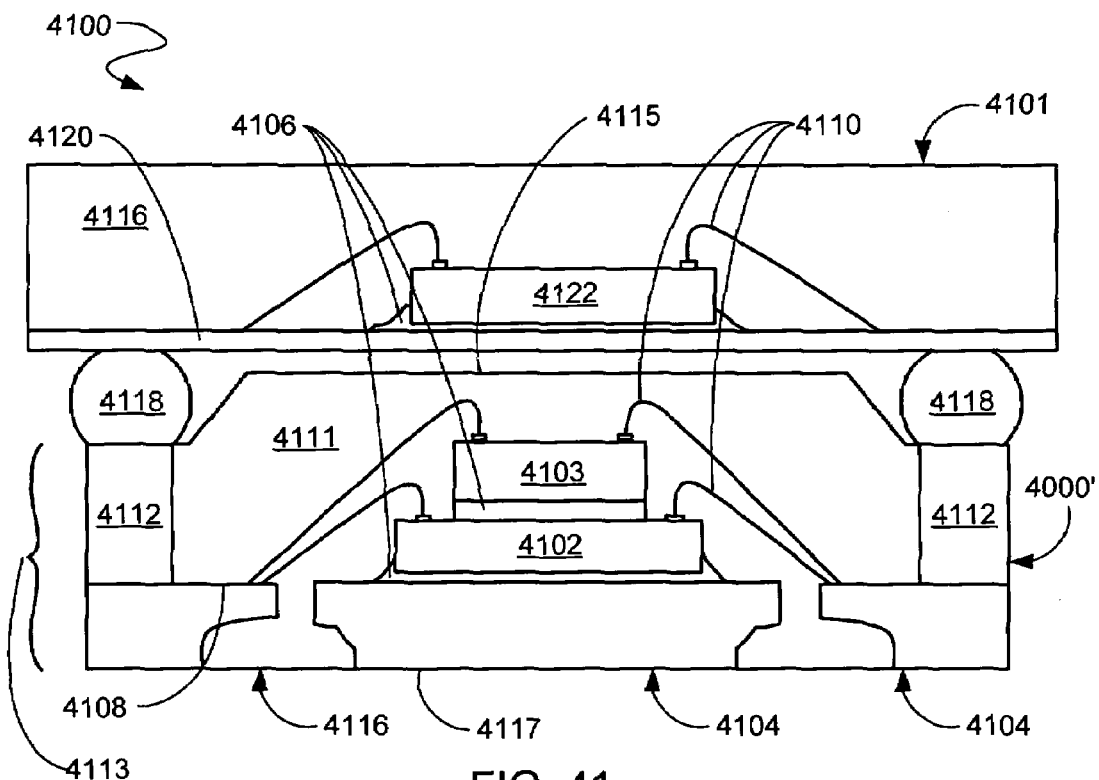
FIG. 41 is a cross sectional view of a laminate ball grid array mounted on die stacked recessed integrated circuit package system in accordance with another embodiment of the present invention.

Referring now to FIG. 41, therein is shown a cross sectional view 4100 of a lead frame ball grid array 4101 mounted on die stacked recessed integrated circuit package system 4000' in accordance with another embodiment of the present invention. A first die 4102 is attached to a first leadframe 4104 with an epoxy 4106. A second die 4103 is attached to the first die 4102 with the epoxy 4106. The first leadframe 4104 has leads 4108 that are electrically connected respectively to the first die 4102 and the second die 4103 with wires 4110. An encapsulant space 4111 is formed on the first leadframe 4104 and encloses the first die 4102, the second die 4103, the epoxy 4106, and the wires 4110. A second leadframe 4112 surrounds the encapsulant space 4111 and is mounted on the first leadframe 4104. The second leadframe 4112 is shorter than an encapsulant 4116. The second leadframe 4112 and the first leadframe 4104 form a leadframe structure 4113, having a planar top surface 4115 and a planar bottom surface 4117. The encapsulant 4116 in the encapsulant space 4111 encapsulates at least portions of the first die 4102, the second die 4103, the first leadframe 4104, the second leadframe 4112 and the wires 4110, filling the spaces therebetween.

On top of the second leadframe 4112, solder bumps 4118 electrically connect the second leadframe 4112 to a laminate 4120. The laminate 4120 is connected to a third die 4122 with the epoxy 4106. The third die 4122 is electrically connected to the laminate 4120 with the wires 4110. The encapsulant 4116 encapsulates the third leadframe 4120, the third die 4122, and the wires 4110, filling the spaces therebetween.

Figure 42:
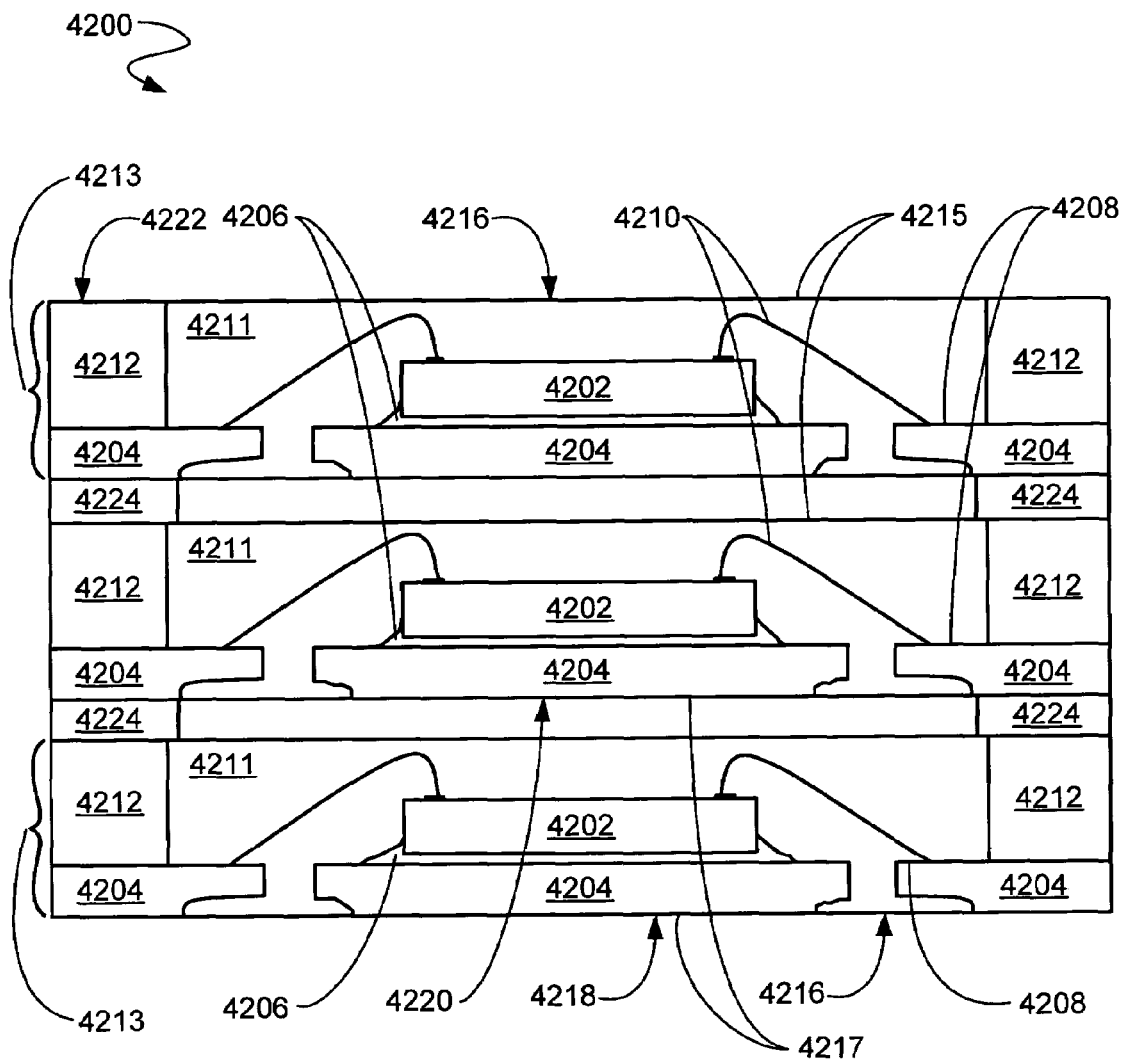
FIG. 42 is a cross sectional view of a stacked lower profile integrated circuit package system in accordance with another embodiment of the present invention.

Referring now to FIG. 42, therein is shown a cross sectional view of a stacked lower profile integrated circuit package system 4200 in accordance with another embodiment of the present invention. Dies 4202 are attached to first leadframes 4204 with epoxy 4206. The first leadframes 4204 have leads 4208 which are electrically connected to the dies 4202 with wires 4210. Encapsulant spaces 4211 are formed on the first leadframes 4204 and enclose the dies 4202, the epoxy 4206, and the wires 4210. Second leadframes 4212 surround the encapsulant spaces 4211 and are mounted on the first leadframes 4204. The second leadframes 4212 and the first leadframes 4204 form leadframe structures 4213, having a planar top surfaces 4215 and a planar bottom surfaces 4217. Encapsulant 4216 in the encapsulant spaces 4211 encapsulates at least portions of the dies 4202, the first leadframes 4204, the second leadframes 4212, and the wires 4210. The encapsulant 4216 is coplanar with the planar top surfaces 4215 and the planar bottom surfaces 4217. Thus, a first integrated circuit package system 4218, a second integrated circuit package system 4220, and a third integrated circuit package system 4222 are formed.

Spacers 4224 are placed on top of the second leadframes 4212. The first integrated circuit package system 4218, the second integrated circuit package system 4220, and the third integrated circuit package system 4222 are stacked with the spacers 4224 in between. There is no limit to the number of package systems that can be stacked. The integrated circuit package systems may be encapsulated and stacked in one embodiment or stacked and then encapsulated in another embodiment.

Figure 43:
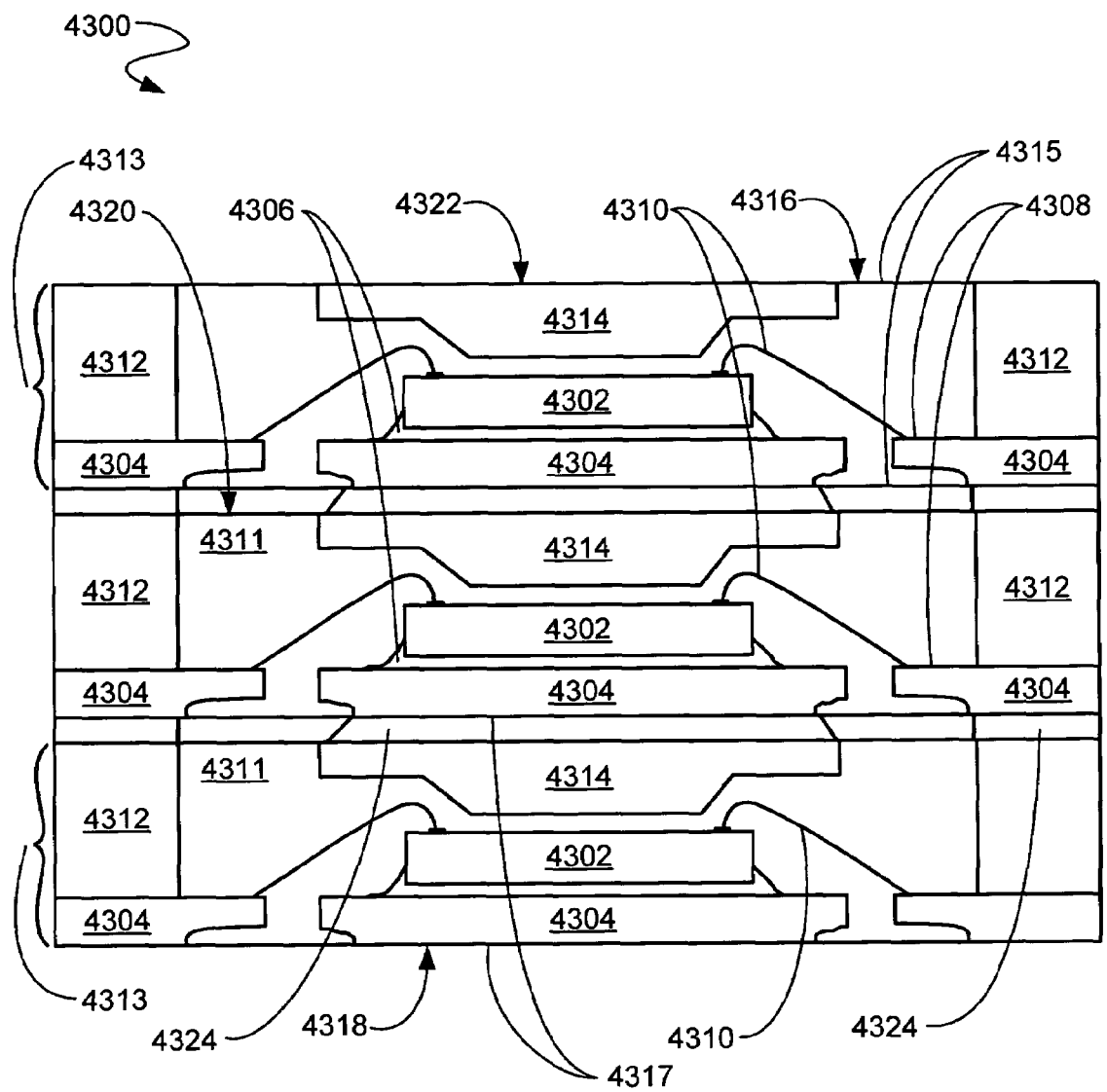
FIG. 43 is a cross sectional view of a stacked integrated circuit package system in accordance with another embodiment of the present invention.

Referring now to FIG. 43, therein is shown a cross sectional view of a stacked integrated circuit package system 4300 in accordance with another embodiment of the present invention. Dies 4302 are attached to first leadframes 4304 with epoxy 4306. The first leadframes 4304 have leads 4308 which are electrically connected to the dies 4302 with wires 4310. Encapsulant spaces 4311 are formed on the first leadframes 4304 and enclose the dies 4302, the epoxy 4306, and the wires 4310. Second leadframes 4312 surround the encapsulant spaces 4211 and are mounted on the first leadframes 4304. The second leadframes 4312 and the first leadframes 4304 form leadframe structures 4313, having a planar top surfaces 4315 and a planar bottom surfaces 4317. Heat sinks 4314 are positioned above the dies 4302 with at least a portion in the encapsulant spaces 4311. Encapsulant 4316 in the encapsulant spaces 4311 encapsulates the dies 4302, the first leadframes 4304, the second leadframes 4312, the wires 4310, and the heat sinks 4314, filling the spaces therebetween. The encapsulant 4316 is coplanar with the planar top surfaces 4315 and the planar bottom surfaces 4317. Thus, a first integrated circuit package system 4318, a second integrated circuit package system 4320, and a third integrated circuit package system 4322 are formed.

Spacers 4324 are placed on top of the second leadframes 4312 and the heat sinks 4314. The first integrated circuit package system 4318, the second integrated circuit package system 4320, and the third integrated circuit package system 4322 are stacked with the spacers 4324 in between. There is no limit to the number of integrated circuit package systems that can be stacked.

Figure 44:
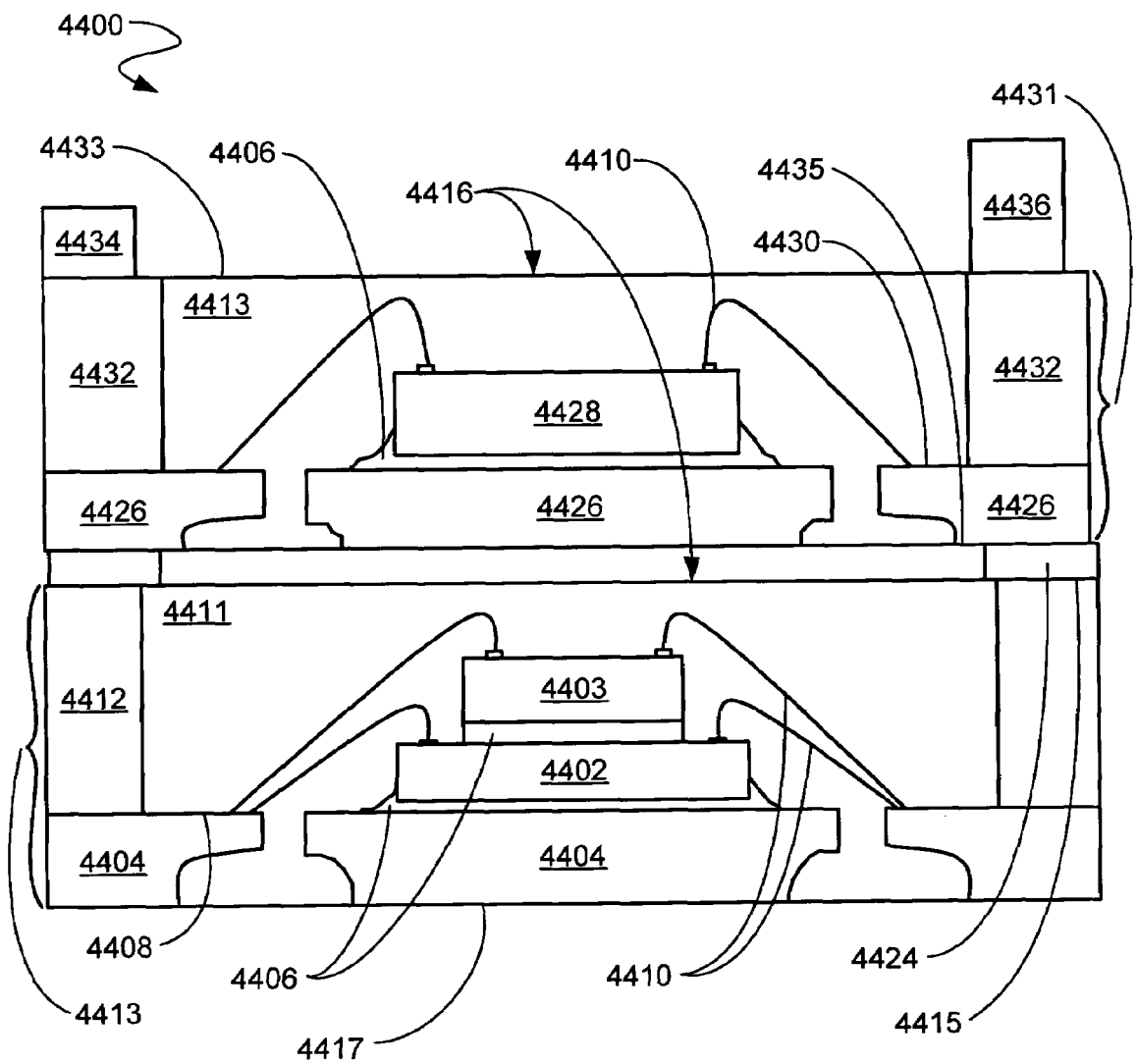
FIG. 44 is a cross sectional view of a mixed stacked integrated circuit package system in accordance with another embodiment of the present invention.

Referring now to FIG. 44, therein is shown a cross sectional view of a mixed stacked integrated circuit package system 4400 in accordance with another embodiment of the present invention. A first die 4402 is attached to a first leadframe 4404 with an epoxy 4406. A second die 4403 is attached to the first die 4402 with the epoxy 4406. The first leadframe 4404 has leads 4408 that are electrically connected respectively to the first die 4402 and the second die 4403 with wires 4410. An encapsulant space 4411 is formed on the first leadframe 4404 and encloses the first die 4402, the second die 4403, the epoxy 4406, and the wires 4410. A second leadframe 4412 surrounds the encapsulant space 4411 and is mounted on the first leadframe 4404. The second leadframe 4412 and the first leadframe 4404 form a leadframe structure 4413, having a planar top surface 4415 and a planar bottom surface 4417. An encapsulant 4416 in the encapsulant space 4411 encapsulates at least portions of the first die 4402, the second die 4403, the first leadframe 4404, the second leadframe 4412 and the wires 4410, filling the spaces therebetween. The encapsulant 4416 is coplanar with the planar top surface 4415 and the planar bottom surface 4417.

Spacers 4424 are placed on top of the second leadframe 4412. A third leadframe 4426 is mounted on top of the spacers 4424. A third die 4428 is attached to the third leadframe 4426 with the epoxy 4406. The third leadframe 4426 has leads 4430 which are electrically connected to the third die 4428 with the wires 4410. A second encapsulant space 4413 is formed on the third leadframe 4426 and encloses the third die 4428, the epoxy 4406, and the wires 4410. A fourth leadframe 4432 surrounds the second encapsulant space 4413 and is mounted on the third leadframe 4426. The fourth leadframe 4332 and the third leadframe 4426 form a second leadframe structure 4431, having a second planar top surface 4433 and a second planar bottom surface 4435. The encapsulant 4416 in the encapsulant second space 4413 encapsulates at least portions of the third die 4428, the third leadframe 4426, the fourth leadframe 4432, and the wires 4410. The encapsulant 4416 is coplanar with the second planar top surface 4433 and the second planar bottom surface 4435. A first passive component 4434, such as a resistor, and a second passive component 4436, such as a capacitor, are mounted on top of the fourth leadframe 4432. There is no limit to the number or combination of integrated circuit package systems and passive components that can be stacked.

Figure 45:
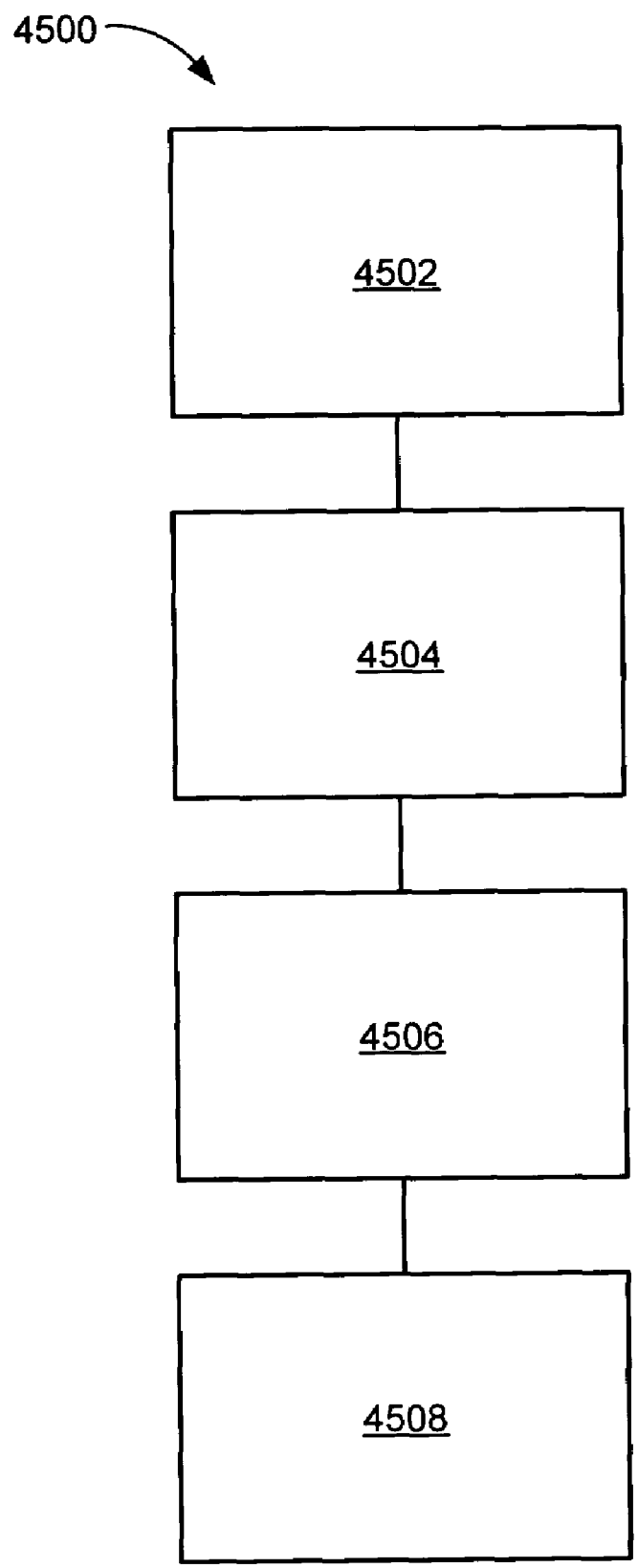
FIG. 45 is a flow chart of an integrated circuit package system for manufacturing an integrated circuit package system in accordance with the present invention.

Referring now to FIG. 45, therein is shown a flow chart of an integrated circuit package system 4500 for manufacturing an integrated circuit package system 103 in accordance with the present invention. The system 4500 includes forming a leadframe structure having a encapsulant space provided predominantly inside the leadframe structure in a block 4502; attaching a die to the leadframe structure in the encapsulant space inside the leadframe structure in a block 4504; electrically connecting the die to the leadframe structure in a block 4506; and injecting encapsulant into the encapsulant space to form the integrated circuit package system in a block 4508.

Thus, it has been discovered that the integrated circuit package system and apparatus of the present invention furnish important and heretofore unknown and unavailable solutions, capabilities, and functional advantages for integrated circuit package systems. The resulting process and configurations are straightforward, economical, uncomplicated, highly versatile, and effective, and can be implemented by adapting known components for ready manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. An integrated circuit package method comprising:
    forming a leadframe structure having an encapsulant space provided predominantly inside the leadframe structure wherein forming the leadframe structure comprises:
        providing a first leadframe having a planar top surface,
        providing a second leadframe around the encapsulant space and having a planar bottom surface, and
        stacking the second leadframe on the first leadframe; and
    attaching a die over and to the leadframe structure in the encapsulant space inside the leadframe structure;
    electrically connecting the die to the leadframe structure; and
    injecting encapsulant into the encapsulant space to form an integrated circuit package system wherein:
        injecting the encapsulant injects the encapsulant to have a top surface coplanar with the planar top surface and a bottom surface coplanar with the planar bottom surface.

2. The method of claim 1 further comprising positioning a heat sink over or under the die before injecting the encapsulant.

3. The method of claim 1 further comprising positioning posts or columns around the die before injecting the encapsulant.

4. The method of claim 1 wherein forming the leadframe structure forms the leadframe structure with undercut sides.

5. The method of claim 1 further comprising:
    providing a further leadframe having a further die electrically connected thereto; and
    mounting the further leadframe on the leadframe structure before injecting the encapsulant.

6. The method of claim 1 wherein forming the leadframe structure includes forming a center thinner than the perimeter or forming a trench therein for attaching the die.

7. The method of claim 1 further comprising:
    manufacturing a second integrated circuit package system; and
    stacking the second integrated circuit package system on the integrated circuit package system.

8. The method of claim 1 further comprising mounting additional electrical components inside the leadframe structure.

9. An integrated circuit package method comprising:
    providing two mold halves;
    forming a leadframe structure having an encapsulant space provided predominantly inside the leadframe structure formed by the two mold halves and the leadframe structure wherein forming the leadframe structure comprises:
        providing a first leadframe defining the encapsulant space and having a planar top surface,
        providing a second leadframe having a planar bottom surface, and
        stacking the second leadframe on the first leadframe;
    providing the two mold halves provides the two mold halves with flat surfaces clampable to the planar top surface and the planar bottom surface;
    attaching a die to and over the leadframe structure in the encapsulant space inside the leadframe structure;
    electrically connecting the die to the leadframe structure using wire bonding, low loop wire bonding ball bonding, solder bonding, or a combination thereof; and
    injecting encapsulant into the encapsulant space with the two mold halves clamped against the leadframe structure to form an integrated circuit package system wherein injecting the encapsulant injects the encapsulant to have a top surface coplanar with the planar top surface and a bottom surface coplanar with the planar bottom surface.

10. The method of claim 9 further comprising positioning a heat sink using posts or adhesive over or under the die before injecting the encapsulant.

11. The method of claim 9 further comprising positioning posts and a top frame or columns around the die before injecting the encapsulant.

12. The method of claim 9 wherein forming the leadframe structure forms the leadframe structure with undercut sides adjacent singulation areas of the integrated circuit package system.

13. The method of claim 9 further comprising:
providing a further leadframe having a further die electrically connected thereto; and
mounting the further leadframe in a flipped position on the leadframe structure before injecting the encapsulant.

14. The method of claim 9 wherein forming the leadframe structure includes forming a center thinner than the perimeter or forming a trench therein for attaching the die.

15. The method of claim 9 further comprising:
manufacturing a second integrated circuit package system;
stacking the second integrated circuit package system on the integrated circuit package system; and
electrically connecting the second integrated circuit package system to the integrated circuit package system.

16. The method of claim 9 further comprising mounting additional active and passive electrical components on and inside the leadframe structure.

17. An integrated circuit package system comprising:
a leadframe structure having an encapsulant space provided predominantly inside the leadframe wherein the leadframe structure comprises:
a first leadframe having a planar top surface, and
a second leadframe around the encapsulant space and having a planar bottom surface, the second leadframe stacked on the first leadframe;
a die bonded over and electrically connected to the leadframe structure in the encapsulant space inside the leadframe structure; and
encapsulant in the encapsulant space to form the integrated circuit package system, the encapsulant having a top surface coplanar with the planar top surface and a bottom surface coplanar with the planar bottom surface.

18. The system of claim 17 further comprising a heat sink over or under the die in contact with the encapsulant.

19. The system of claim 17 further comprising posts or columns around the die in the encapsulant.

20. The system of claim 17 wherein the leadframe structure has undercut sides.

21. The system of claim 17 further comprising:
a further leadframe having a further die electrically connected thereto; and
the further leadframe on the leadframe structure bonded by the encapsulant.

22. The system of claim 17 wherein the leadframe structure includes a center thinner than the perimeter or forming a trench therein for attaching the die.

23. The system of claim 17 further comprising:
a second integrated circuit package system; and
the second integrated circuit package system stacked on the integrated circuit package system.

24. The system of claim 17 further comprising additional electrical components inside the leadframe structure.

25. An integrated circuit package system comprising:
a leadframe structure having an encapsulant space provided predominantly inside the leadframe structure wherein the leadframe structure comprises:
a first leadframe defining the encapsulant space and having a planar top surface, and
a second leadframe having a planar bottom surface, the second leadframe stacked on the first leadframe;
a die attached over and electrically connected to the leadframe structure in the encapsulant space inside the leadframe structure by wire bonding, low loop wire bonding ball bonding, solder bonding, or a combination thereof; and
an encapsulant in the encapsulant space to form the integrated circuit package system, the encapsulant having a top surface coplanar with the planar top surface and a bottom surface coplanar with the planar bottom surface.

26. The system of claim 25 further comprising a heat sink having posts or adhesive over or under the die before injecting the encapsulant.

27. The system of claim 25 further comprising posts and a top frame or columns around the die in the encapsulant.

28. The system of claim 25 wherein the leadframe structure has undercut sides adjacent singulation areas of the integrated circuit package system.

29. The system of claim 25 further comprising:
a further leadframe having a further die electrically connected thereto and the further leadframe in a flipped position on the leadframe structure in the encapsulant.

30. The system of claim 25 wherein the leadframe structure includes a center thinner than the perimeter or a trench having the die attached.

31. The system of claim 25 further comprising:
a second integrated circuit package system; and
the second integrated circuit package system stacked on the integrated circuit package system, and the second integrated circuit package system electrically connected to the integrated circuit package system.

32. The system of claim 25 further comprising additional active and passive electrical components on and inside the leadframe structure.

* * * * *